(12) United States Patent
Shimosako

(10) Patent No.: US 7,978,555 B2
(45) Date of Patent: Jul. 12, 2011

(54) SEMICONDUCTOR MEMORY

(75) Inventor: Koji Shimosako, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 98 days.

(21) Appl. No.: 12/560,170

(22) Filed: Sep. 15, 2009

(65) Prior Publication Data

US 2010/0008120 A1 Jan. 14, 2010

Related U.S. Application Data

(63) Continuation of application No. PCT/JP2007/000258, filed on Mar. 19, 2007.

(51) Int. Cl.
*G11C 7/02* (2006.01)

(52) U.S. Cl. ............... 365/210.1; 365/51; 365/63

(58) Field of Classification Search .......... 365/51, 365/63, 210.1, 210.15, 149, 154
See application file for complete search history.

(56) References Cited

U.S. PATENT DOCUMENTS

| | | | |
|---|---|---|---|
| 5,945,702 A | 8/1999 | Nakanishi | |
| 6,078,522 A | 6/2000 | Park et al. | |
| 6,438,052 B1 * | 8/2002 | Sekine | 365/149 |
| 6,441,469 B1 * | 8/2002 | Chrysostomides et al. | 257/659 |
| 6,690,608 B2 * | 2/2004 | Nii et al. | 365/210.1 |
| 2003/0202412 A1 | 10/2003 | Nii et al. | |
| 2004/0027852 A1 | 2/2004 | Watanabe et al. | |
| 2006/0164881 A1 | 7/2006 | Oki | |

FOREIGN PATENT DOCUMENTS

| | | |
|---|---|---|
| JP | 61-214559 A | 9/1986 |
| JP | 10-150163 A | 6/1998 |
| JP | 2000-31306 A | 1/2000 |
| JP | 2003-323792 A | 11/2003 |
| JP | 2004-71118 A | 3/2004 |
| JP | 2005-333084 A | 12/2005 |
| JP | 2006-209837 A | 8/2006 |
| KR | 2002-0036134 A | 5/2002 |

* cited by examiner

*Primary Examiner* — Gene N Auduong
(74) *Attorney, Agent, or Firm* — Arent Fox, LLP

(57) ABSTRACT

Dummy memory cells are disposed on an outside of real memory cells positioned on a peripheral part of a matrix. First contacts coupling between two wiring layers laminated on a semiconductor substrate are disposed around each of the real and dummy memory cells, and are shared by an adjacent real or dummy memory cell. Number of the first contacts disposed in each of the dummy memory cells is set to be smaller than number of the first contacts disposed in each of the real memory cells. Accordingly, even when a well region is not formed normally due to a variation in manufacturing conditions, it is possible to prevent an abnormal power supply current from being flown into the dummy memory cells, and an occurrence of latch up can be prevented.

10 Claims, 24 Drawing Sheets

SEMICONDUCTOR MEMORY

CROSS REFERENCE TO RELATED APPLICATIONS

This application is based upon and claims the benefit of the prior International Patent Application No. PCT/JP2007/000258, filed Mar. 19, 2007, the entire contents of which are incorporated herein by reference.

FIELD

The present embodiments relate to a semiconductor memory having dummy memory cells disposed around real memory cells.

BACKGROUND

Generally, in a semiconductor memory such as an SRAM, a density of layout pattern of a memory cell is higher than a density of layout pattern of a peripheral circuit. Accordingly, a photo resist is likely to be deformed, in a boundary between a memory cell array and the peripheral circuit, due to an effect of halation or the like. In recent years, in accordance with a microfabrication of device structure, a shape of the photo resist becomes smaller, resulting that the photo resist becomes likely to be deformed or a position thereof becomes likely to be displaced. For example, if a photo resist used for forming a gate or the like of a transistor is deformed, the transistor may not operate normally. In particular, a memory cell located on a peripheral part of the memory cell array is susceptible to the halation, and thus is likely to be a defect. In order to prevent a defect caused by this type of deformation or positional displacement of the photo resist, a method of disposing dummy memory cells around the memory cell array has been proposed (for instance, refer to Japanese laid-open Patent Publication No. 61-214559).

A dummy memory cell is disposed for preventing a deformation and a positional displacement of a gate of a transistor or a wiring pattern formed on a semiconductor substrate. Meanwhile, the dummy memory cell cannot prevent a deformation of a shape of a well region formed on a surface of the semiconductor substrate. Generally, the dummy memory cell has a same layout structure as that of a real memory cell that holds data. For this reason, if a photo resist that forms the well region is deformed, or a position of the photo resist is displaced, the dummy memory cell close to an end portion of the well region may flow an abnormal power supply current even when a shape of the gate or the like is normal (leak failure). For example, if a photo resist is deformed in a manufacturing process for forming an n-type well region on the semiconductor substrate, and an opening size of the photo resist for forming the n-type well region is increased, the n-type well region becomes large. Accordingly, if a diffusion area (a source and a drain of a transistor of the dummy memory cell) of a p-type well region adjacent to a boundary of the n-type well region is short-circuited with the n-type well region, an unexpected leak current (power supply current) is flown. This current may trigger a latch up.

A proposition of the present embodiments are to prevent, in a semiconductor memory having dummy memory cells, an abnormal power supply current from being flown into the dummy memory cells even when a well region is not formed normally.

SUMMARY

In one embodiment, real memory cells are disposed in a matrix shape. Dummy memory cells are disposed on an outside of the real memory cells positioned on a peripheral part of the matrix. First contacts coupling between two wiring layers laminated on a semiconductor substrate are disposed around each of the real and dummy memory cells and are shared by an adjacent real or dummy memory cell.

The number of the first contacts disposed in each of the dummy memory cells is set to be smaller than the number of the first contacts disposed in each of the real memory cells. In the semiconductor memory, during its manufacture, a shape of a photo resist is changed in a boundary between the matrix of the memory cells and a peripheral circuit due to a difference in densities of layout patterns, resulting that a well region may not be formed normally. At this time, in the dummy memory cell, a well region of a certain polarity and a diffusion layer area formed in a well region of a different polarity adjacent to the well region of the certain polarity may be short-circuited. However, in the present embodiment, the dummy memory cells are formed with lack of a part of the first contacts. Therefore, even when the well region is not formed normally due to a variation in manufacturing conditions, it is possible to prevent an abnormal power supply current from being flown into the dummy memory cells. In other words, it is possible to prevent an occurrence of latch up caused by the short-circuit between the well region and the diffusion layer area.

In a preferred example of one embodiment, in the dummy memory cell, the first contact disposed in a boundary area adjacent to the real memory cell is shared by the real memory cell. In each of the dummy memory cells, at least one of the first contacts disposed in a boundary area which is not adjacent to the real memory cell is lacking compared to the first contacts in the real memory cell. Accordingly, it is possible to prevent the occurrence of latch up without lacking the first contacts coupled to the real memory cells.

In a preferred example of one embodiment, the dummy memory cell disposed under a word line and the dummy memory cell disposed under a bit line orthogonal to the word line have the different number of the first contacts formed therein. By changing a specification of the first contact in accordance with a position of the dummy memory cell, it is possible to prevent the occurrence of latch up in a best way according to the position of the dummy memory cell.

In a preferred example of one embodiment, the number and a structure of the transistors formed in the dummy memory cell are the same as the number and a structure of the transistors formed in the real memory cell. Alternatively, at least a part of the transistors of the dummy memory cell has the same structure as that the structure of the transistor of the real memory cell. Accordingly, it is possible to prevent a deformation of a shape of the transistor or the like of the real memory cell positioned on the peripheral part. In other words, even when a countermeasure against the latch up is performed on the dummy memory cell, it is possible to prevent a function of the dummy memory cell from being deteriorated.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Figure 1:
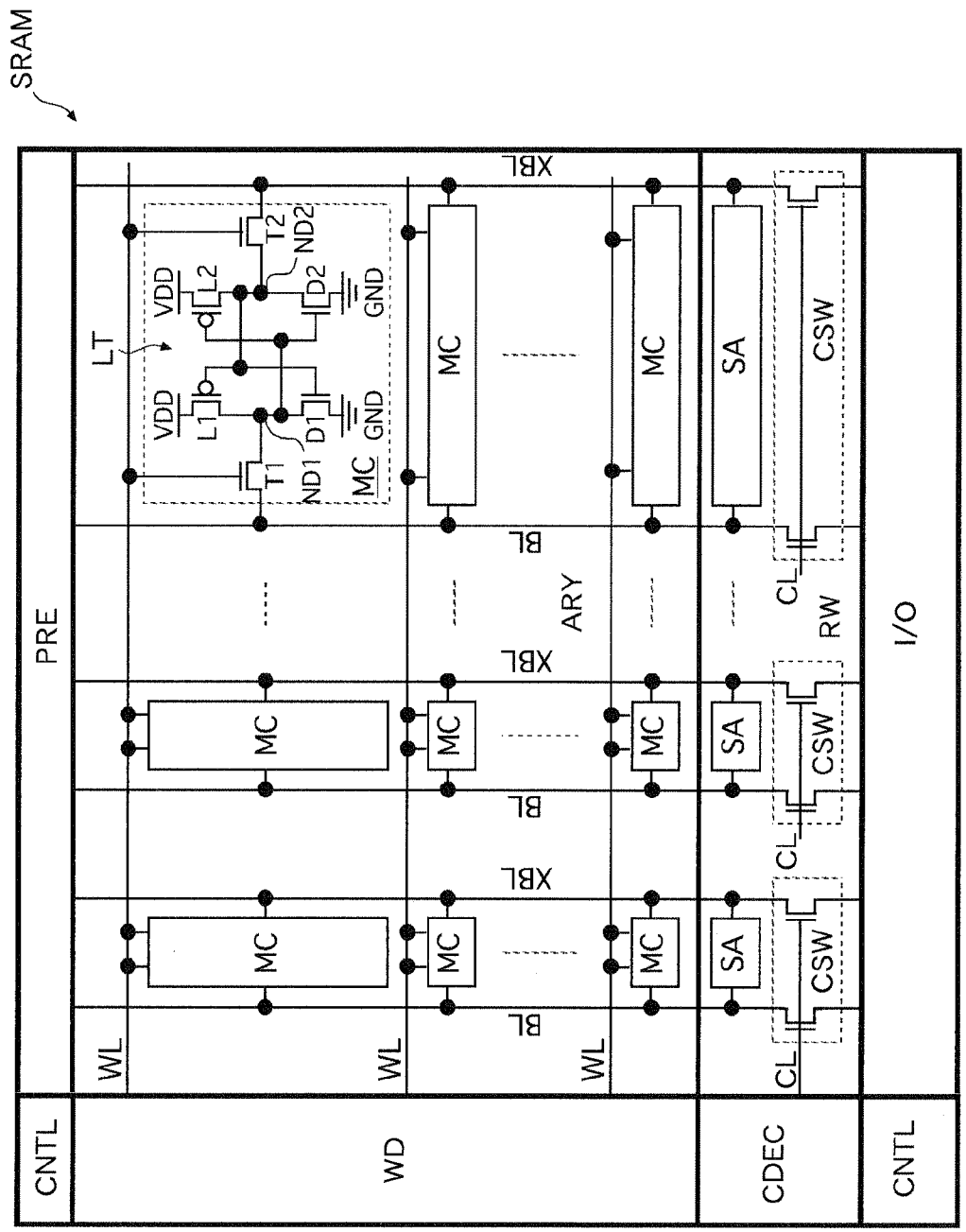
FIG. 1 illustrates a block diagram depicting a first embodiment.

Hereinafter, embodiments will be explained with reference to the drawings. In the drawings, each signal line illustrated by the thick line consists of a plurality of lines. Further, some of the blocks coupled to the thick lines consist of a plurality of circuits, respectively. The signal lines through which signals are transmitted are designated by the same reference symbols as the names of the signals.

FIG. 1 illustrates a first embodiment. A semiconductor memory is, for instance, an SRAM manufactured by using a 90 nm process. The SRAM is formed as a single semiconductor chip or an SRAM macro which is mounted on a system LSI together with a controller such as a CPU. The SRAM includes a word driver WD, a column decoder CDEC, a data input/output circuit I/O, a read/write control circuit RW, a precharge circuit PRE, an operation control circuit CNTL and a memory cell array ARY.

At a time of a read operation and a write operation, the word driver WD activates either of word lines WL from a low level to a high level in accordance with an address signal (row address) supplied from an outside. At the time of the read operation and the write operation, the column decoder CDEC activates a column selection signal CL for turning either of column switches CSW on, from a low level to a high level, in accordance with an address signal (column address) supplied from the outside.

The data input/output circuit I/O outputs read data output from real memory cells MC via bit lines BL, XBL and the column switches CSW at the time of the read operation, to an external data terminal. Further, the data input/output circuit I/O outputs write data received by the external data terminal at the time of the write operation, to the real memory cells MC via the column switches CSW.

The read/write control circuit RW includes sense amplifiers SA, write amplifiers WA (illustrated in FIG. 2) and the column switches CSW. The sense amplifier SA is formed for each bit line pair BL, XBL. Each of the sense amplifiers SA differential-amplifies a voltage difference between the bit lines BL, XBL at the time of the read operation and the write operation. The write amplifier WA amplifies a signal amount of the write data and supplies it to the bit lines BL, XBL as complementary data signals. The column switch CSW is formed of, for instance, an nMOS transistor, and is turned on when the column selection signal is at a high level.

The precharge circuit PRE includes a plurality of transistor switches coupling the bit line pairs BL, XBL to precharge voltage lines (for instance, power supply lines VDD). The precharge circuit PRE precharges the bit line pair BL, /BL to a high level voltage in a standby period during which the real memory cells MC are not accessed. The standby period is a period during which the write operation and the read operation are not executed and the word lines WL are inactivated to a low level. A power supply voltage VDD may be supplied from an outside of the SRAM, or may be generated inside the SRAM.

The operation control circuit CNTL outputs a control signal (timing signal) controlling operations of the word driver WD, the column decoder CDEC, the data input/output circuit I/O, the read/write control circuit RW and the precharge circuit PRE in accordance with a command signal supplied from the outside of the SRAM. The command signal is, for instance, a chip select signal, a write enable signal or an output enable signal. The operation control circuit CNTL detects, in accordance with a combination of logics of the command signals described above, a read command for executing the read operation, a write command for executing the write operation, and a standby state.

The memory cell array ARY includes a plurality of real memory cells MC disposed in a matrix shape, word lines WL coupled to the real memory cells MC arranged in a lateral direction in the drawing (first direction), and complementary bit line pairs BL, XBL coupled to the real memory cells MC arranged in a vertical direction in the drawing (second direction). The real memory cells MC are coupled to the bit line pairs BL, XBL and the word lines WL. The real memory cells MC arranged in the vertical direction in the drawing are coupled to the same bit line pairs BL, XBL. The real memory cells MC arranged in the lateral direction in the drawing are coupled to the same word lines WL.

The real memory cell MC is formed of a pair of CMOS inverters, and includes a latch LT having complementary input/output nodes ND1, ND2, and a pair of transfer transistors T1, T2 (nMOS transistors) each having a source and a drain coupled to either of the input/output nodes ND1, ND2. The CMOS inverter whose output is coupled to the node ND1 is formed of a load transistor L1 (pMOS transistor) and a driver transistor D1 (nMOS transistor). The CMOS inverter whose output is coupled to the node ND2 is formed of a load transistor L2 (pMOS transistor) and a driver transistor D2 (nMOS transistor). Specifically, the memory cell MC is a 6-transistor type static memory cell. Sources of the load transistors L1, L2 are coupled to the power supply lines VDD. Sources of the driver transistors D1, D2 are coupled to ground lines VSS. Note that, although not illustrated in FIG. 1, the memory cell array ARY includes dummy memory cells DMC (DMC1, DMC2 in FIG. 2) and tap cells (TP in FIG. 2).

Figure 2:
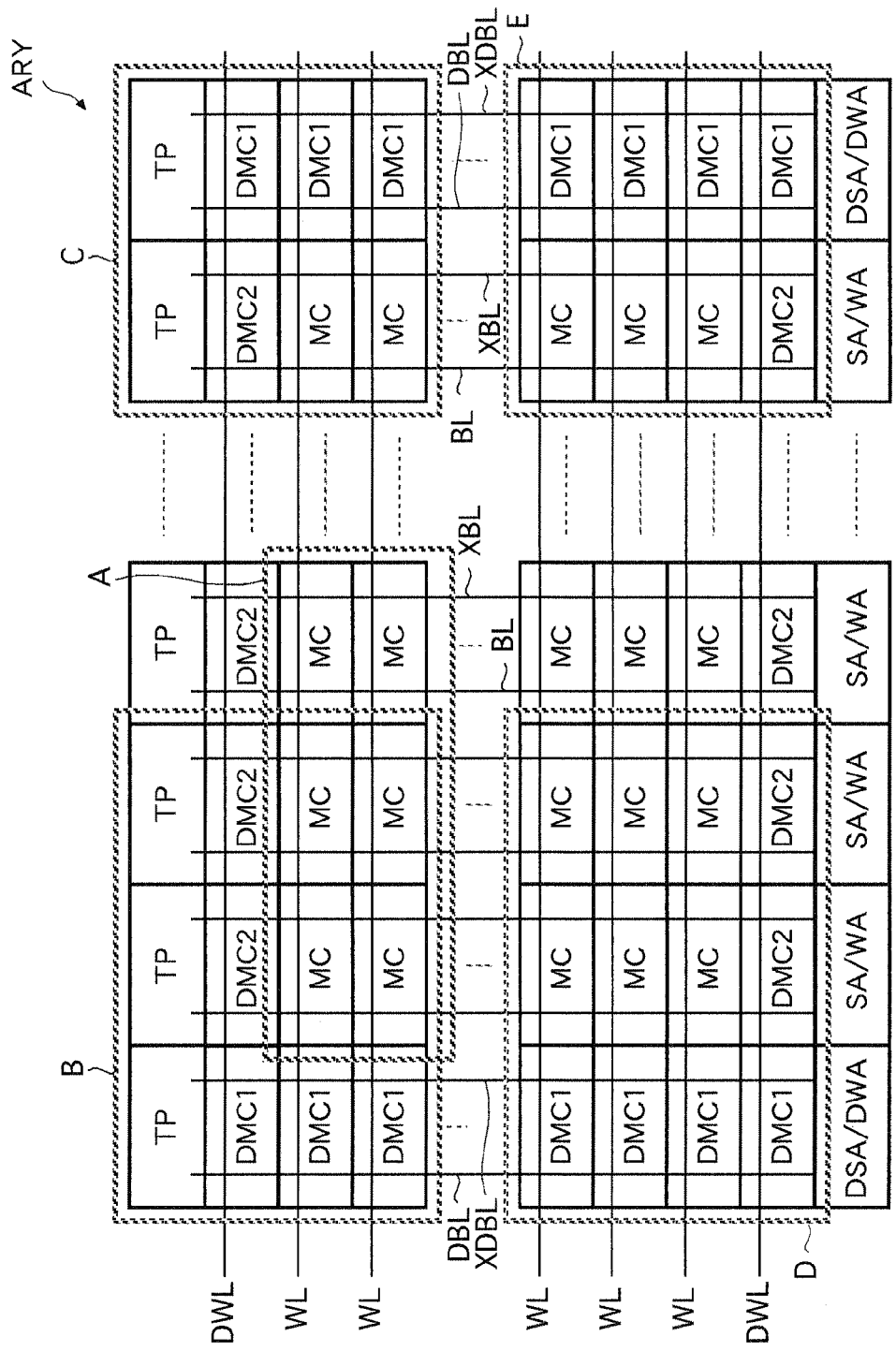
FIG. 2 illustrates a block diagram depicting details of a memory cell array illustrated in FIG. 1.

FIG. 2 illustrates details of the memory cell array ARY illustrated in FIG. 1. The dummy memory cells DMC1 are disposed along dummy bit lines DBL, XDBL on both left and right sides of the matrix of the real memory cells MC in the drawing. The dummy memory cells DMC2 are disposed along dummy word lines DWL on both upper and lower sides of the matrix of the real memory cells MC in the drawing. As above, the dummy memory cells DMC1, DMC2 are disposed in a frame shape on a peripheral part of the matrix of the real memory cells MC. Details of the dummy memory cells DMC1, DMC2 are illustrated in later-described FIG. 4 and FIG. 5.

The dummy bit lines DBL, XDBL are coupled to dummy sense amplifiers DSA and dummy write amplifiers DWA, and not-illustrated dummy column switches. On an upper side of a row of the dummy memory cells DMC1, DMC2 coupled to the dummy word line DWL on an upper side of the drawing, the tap cells TP are disposed. The tap cell TP includes contacts for supplying the power supply voltage VDD and a ground voltage VSS to an n-type well region and a p-type well region of a semiconductor substrate. Details of the tap cell TP are illustrated in later-described FIG. 8 and FIG. 9.

Figure 3:
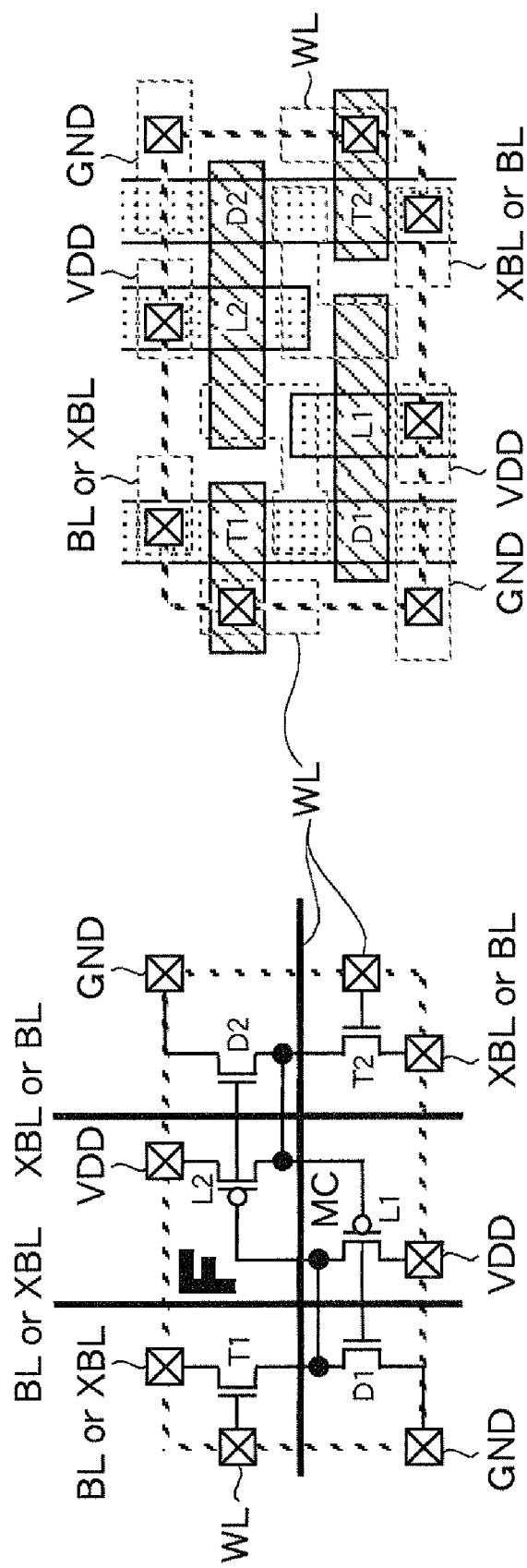
FIG. 3 illustrates an explanatory diagram depicting details of layout of a real memory cell illustrated in FIG. 2.

FIG. 3 illustrates details of layout of the real memory cell MC illustrated in FIG. 2. A left side of the drawing illustrates a coupling relation among transistors, and a right side of the drawing illustrates a pattern shape of a photo mask used for forming the memory cell MC. A quadrangle illustrated by a thick dashed line indicates an outer shape of the memory cell MC, and a cross-marked square indicates a first contact. The first contacts are disposed around the memory cells MC to couple between first metal wiring layers and second metal wiring layers, and are shared by adjacent memory cells MC, DMC1, or DMC2. The first metal wiring layer is a metal wiring layer closest to the semiconductor substrate. The second metal wiring layer is a metal wiring layer positioned above the first metal wiring layer.

For example, the first contact is formed as a plug by burying a conductive material in a through hole formed between the first metal wiring layer and the second metal wiring layer. In a manufacturing process of the semiconductor memory, the through hole is formed in an insulator film formed on the first metal wiring layer, and the plug is formed. Thereafter, the insulator film and an upper portion of the plug are shaved to flatten a surface of the insulator film, and the second metal wiring layer is formed on the flattened insulator film. A planarization is conducted by using an etch back or CMP (Chemical Mechanical Polishing) technology. If there is provided a planarization process in the formation of the first contact, the second metal wiring layer is always flattened regardless of the presence/absence of the first contact, and a wiring shape thereof takes the same shape as a pattern shape of a photo resist. On the contrary, if the planarization process is not provided, a step is generated between a portion in which the first contact exists and a portion in which the first contact does not exist. Accordingly, the second metal wiring layer is not flattened, resulting that a part of the wiring shape thereof may not take the same shape as the pattern shape of the photo resist.

A symbol F in the drawing indicates a direction of a transcription of layout pattern, as illustrated in later-described FIG. 7 and the like. Note that, a contact for coupling the first metal wiring layer to a diffusion layer is formed on each source and drain of the transistors T1, T2, L1, L2, D1, D2. Reference numerals and symbols T1, T2, L1, L2, D1, D2 attached to the transistors correspond to the reference numerals and symbols attached in FIG. 1.

On the right side of the drawing, a half-tone dot meshing pattern illustrated by a solid line indicates the diffusion layer. A pattern illustrated by an oblique-lined rectangle indicates a polysilicon layer. A pattern illustrated by a dashed line indicates the first metal wiring layer. The first metal wiring layer can be coupled to the polysilicon layer with no contact intervened therebetween. The polysilicon disposed on the diffusion layer forms a gate of a transistor. A diffusion layer pattern at a lower side of the gate forms a channel of the transistor. Diffusion layer areas located on both sides of the gate form a source or a drain of the transistor. On the left side of the drawing, the word line WL and the bit lines BL, XBL illustrated by a thick line are wired by using the second metal wiring layers located upper of the first metal wiring layers.

Figure 4:
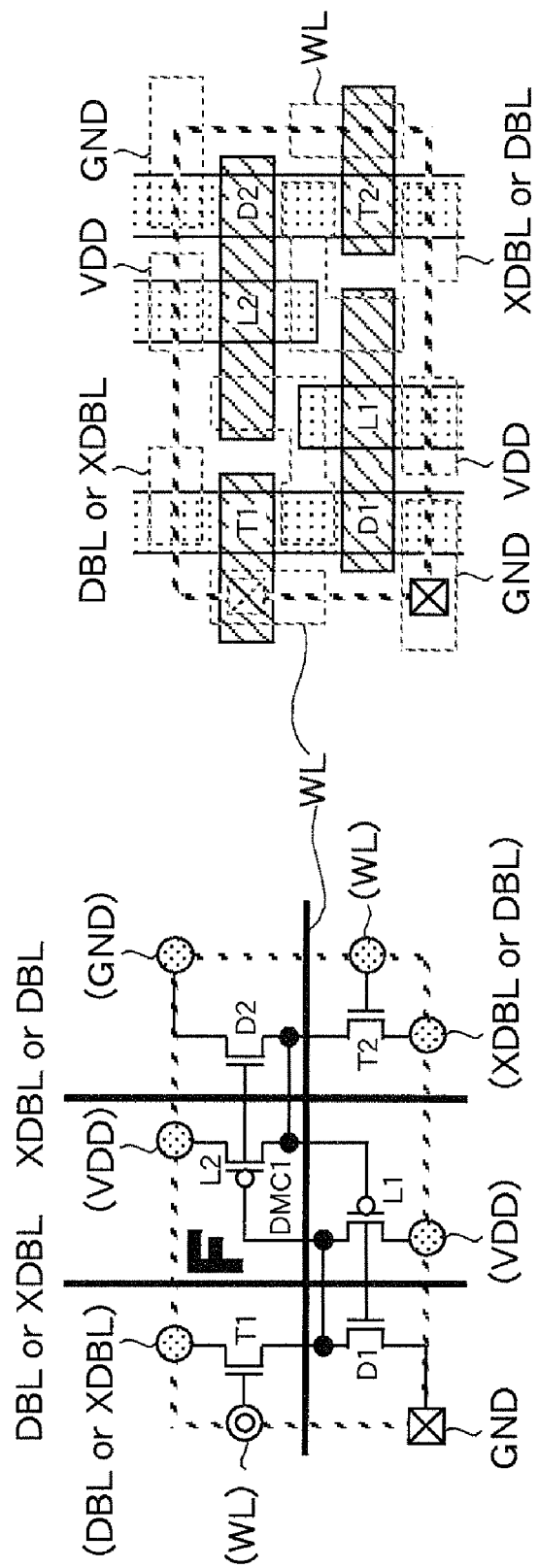
FIG. 4 illustrates an explanatory diagram depicting details of layout of a dummy memory cell DMC1 illustrated in FIG. 2.

FIG. 4 illustrates details of layout of the dummy memory cell DMC1 illustrated in FIG. 2. The dummy memory cell DMC1 includes the same transfer transistors T1, T2, load transistors L1, L2, and driver transistors D1, D2 as those in the real memory cell MC. Specifically, the number and structure (size) of the transistors formed in the dummy memory cell DMC1 are the same as the number and structure (size) of the transistors formed in the real memory cell MC.

On the left side of the drawing, a half-tone dot meshing circle mark indicates that there is no first contact corresponding to the first contact which is supposed to be disposed in the real memory cell MC. A double circle indicates that the first contact coupled to the word line WL is disposed when the real memory cell MC is disposed adjacent to the memory cell, and the first contact does not exist when the real memory cell MC is not disposed adjacent to the memory cell. On the right side of the drawing, a cross-marked square illustrated by a dashed line (which is adjacent to the transistor T1) corresponds to the double circle on the left side of the drawing. The other structure is the same as the structure of the real memory cell MC illustrated in FIG. 3. Specifically, in the dummy memory cell DMC1, the source of the driver transistor D1 is surely coupled to the ground line GND via the first contact. As confirmed from the comparison between FIG. 3 and FIG. 4, the number of the first contacts in the dummy memory cell DMC1 is smaller than the number of the first contacts disposed in the real memory cell MC.

Figure 5:
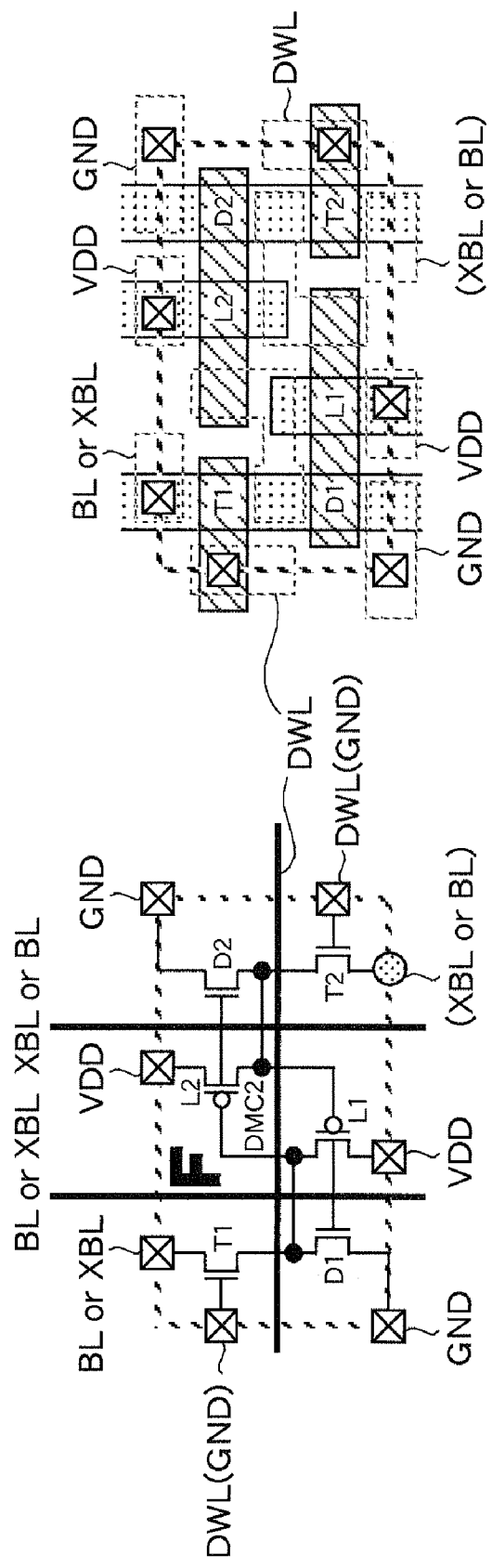
FIG. 5 illustrates an explanatory diagram depicting details of layout of a dummy memory cell DMC2 illustrated in FIG. 2.

FIG. 5 illustrates details of layout of the dummy memory cell DMC2. The dummy memory cell DMC2 includes the same transfer transistors T1, T2, load transistors L1, L2, and driver transistors D1, D2 as those in the real memory cell MC. Specifically, the number and structure (size) of the transistors formed in the dummy memory cell DMC2 are the same as the number and structure (size) of the transistors formed in the real memory cell MC.

In the dummy memory cell DMC2, there is no first contact which is supposed to couple the transfer transistor T2 to the bit line XBL (or BL). The other first contacts are disposed in the same manner as in the real memory cell MC. The other structure is the same as the structure of the real memory cell MC illustrated in FIG. 3. As confirmed from the comparison among FIG. 3, FIG. 4 and FIG. 5, the number of the first contacts in the dummy memory cell DMC2 is smaller than the number of the first contacts disposed in the real memory cell MC, and is larger than the number of the first contacts disposed in the dummy memory cell DMC1. In other words, the dummy memory cells DMC1, DMC2 have the mutually different number of the first contacts disposed therein.

However, the planarization process is conducted after the formation of the first contact, as described above, so that there is no chance that the wiring shape of the second metal wiring layer is changed depending on the presence/absence of the first contact. Specifically, the second metal wires of the real memory cell MC and the dummy memory cells DMC1, DMC2 take mutually the same shape. Meanwhile, when a part of the diffusion layer is eliminated in order to block a current path, there is a need to eliminate not only the diffusion layer but also a contact coupled to the diffusion layer. For this reason, when a part of the diffusion layer is eliminated from layout data of a semiconductor memory which has been already developed, two layers of layout data have to be changed. On the contrary, in the present embodiment, it is only required to change layout data of the first contact.

Figure 6:
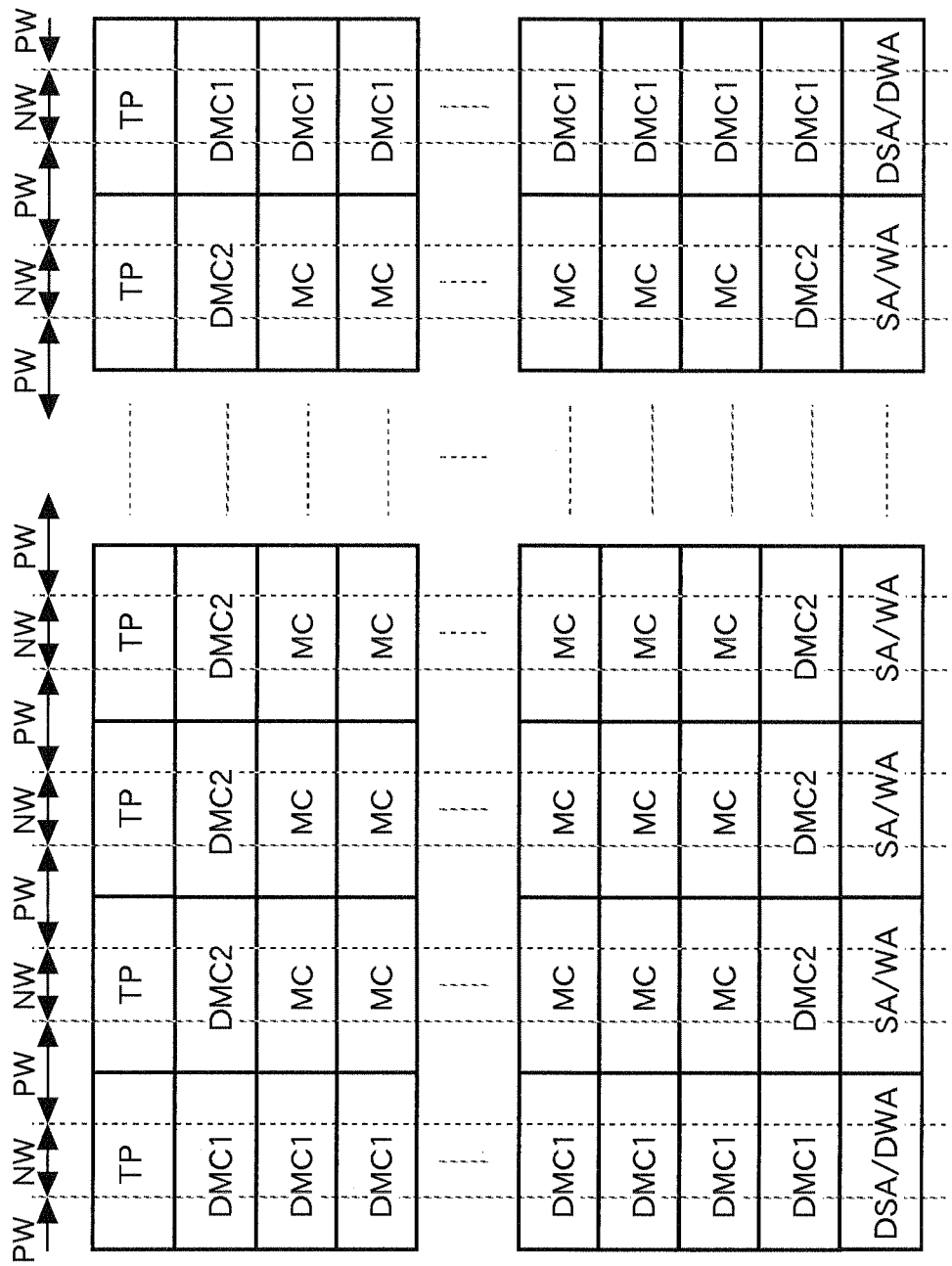
FIG. 6 illustrates a layout diagram depicting an outline of a semiconductor substrate of the memory cell array illustrated in FIG. 2.

FIG. 6 illustrates an outline of the semiconductor substrate of the memory cell array ARY illustrated in FIG. 2. As illustrated in FIG. 3 to FIG. 5, in each of the memory cells MC, DMC1, DMC2, the nMOS transistors are formed on both sides in the lateral direction in the drawing, and the pMOS transistors are formed on a center of the drawing. Accordingly, n-type well regions NW being substrate regions of the pMOS transistors are formed on center portions of the memory cells MC, DMC1 (or DMC2) and the tap cells TP arranged in the vertical direction in FIG. 6. Substrate regions of the nMOS transistors, namely, p-type well regions PW are formed on both side portions of the memory cells MC, DMC1 (or DMC2) and the tap cells TP arranged in the vertical direction in FIG. 6. The p-type well regions PW are commonly formed by the adjacent memory cells MC, DMC1, DMC2, and the tap cells TP. Widths of the well regions NW, PW in the memory cells MC, DMC1, DMC2 are narrow compared to those in a peripheral circuit disposed around the memory cell array ARY. For this reason, at a peripheral part of the memory cell array ARY (dummy memory cells DMC1, DMC2) in which layout densities of the well regions NW, PW are changed, a photo resist used for forming the well regions NW, PW is likely to be deformed. In the present embodiment, even when the photo resist for the well regions NW, PW is deformed, it is possible to prevent an abnormal power supply current from being flown, resulting that the latch up can be prevented, as will be described later.

Figure 7:
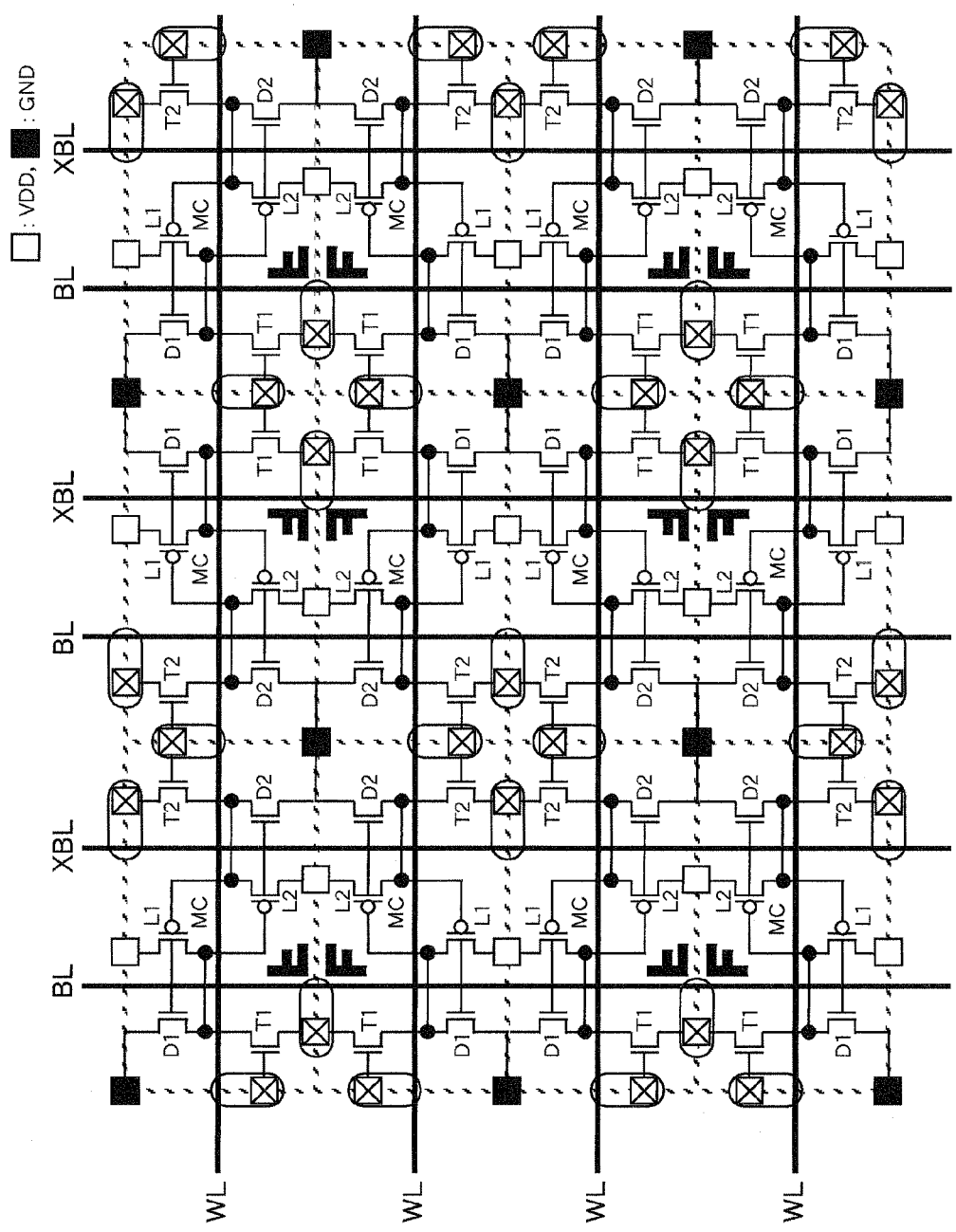
FIG. 7 illustrates a layout diagram depicting a region A illustrated in FIG. 2.

FIG. 7 illustrates a layout of a region A in FIG. 2. A white rectangle in the drawing indicates the first contact coupled to the power supply line VDD. A black rectangle indicates the first contact coupled to the ground line GND. A long circle indicates that the first contact is coupled, via a wire or a contact of another layer, to the word line WL or the bit lines BL, XBL of an upper layer. The first contact is shared by the adjacent real memory cell MC.

Figure 8:
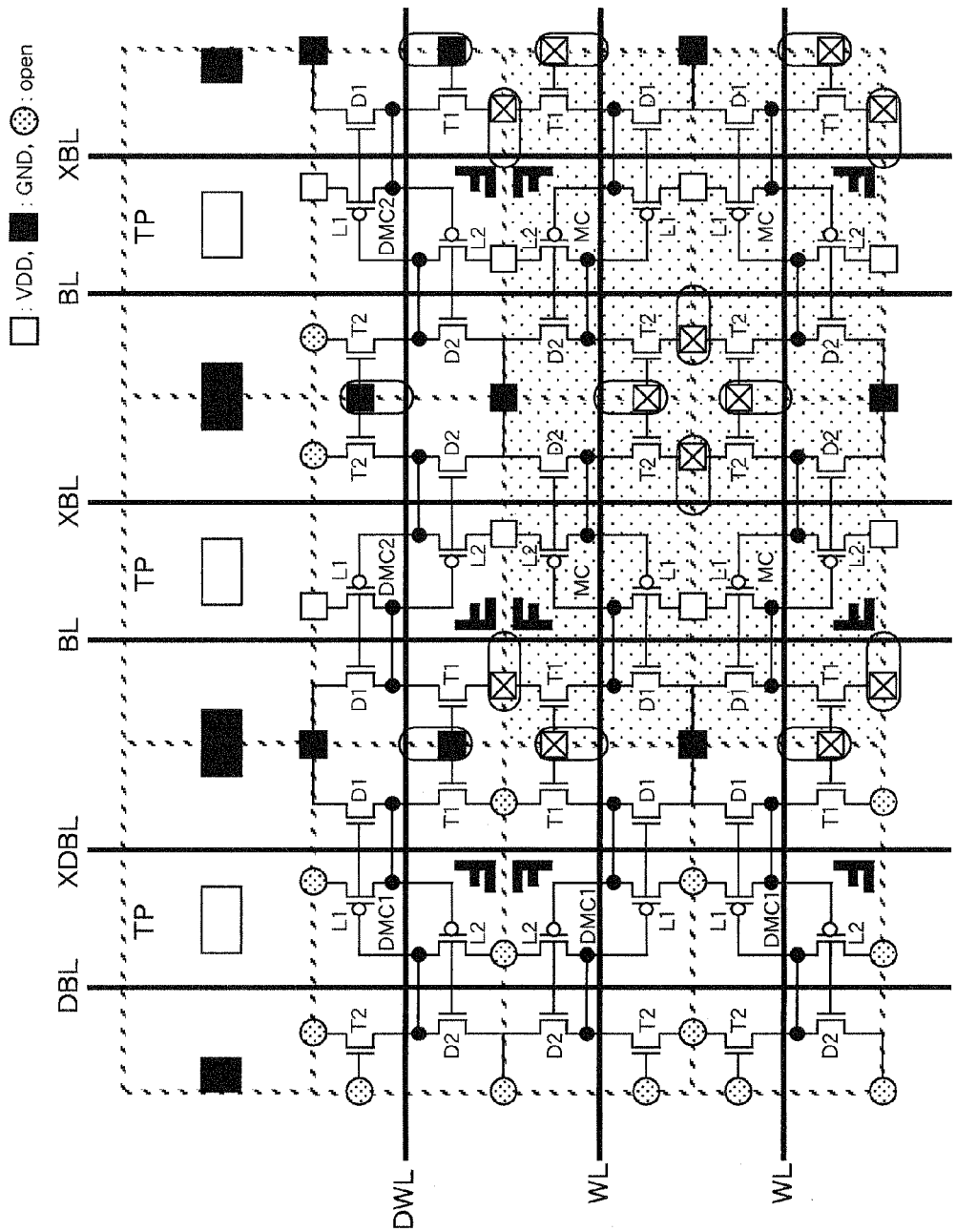
FIG. 8 illustrates a layout diagram depicting a region B illustrated in FIG. 2.
Figure 9:
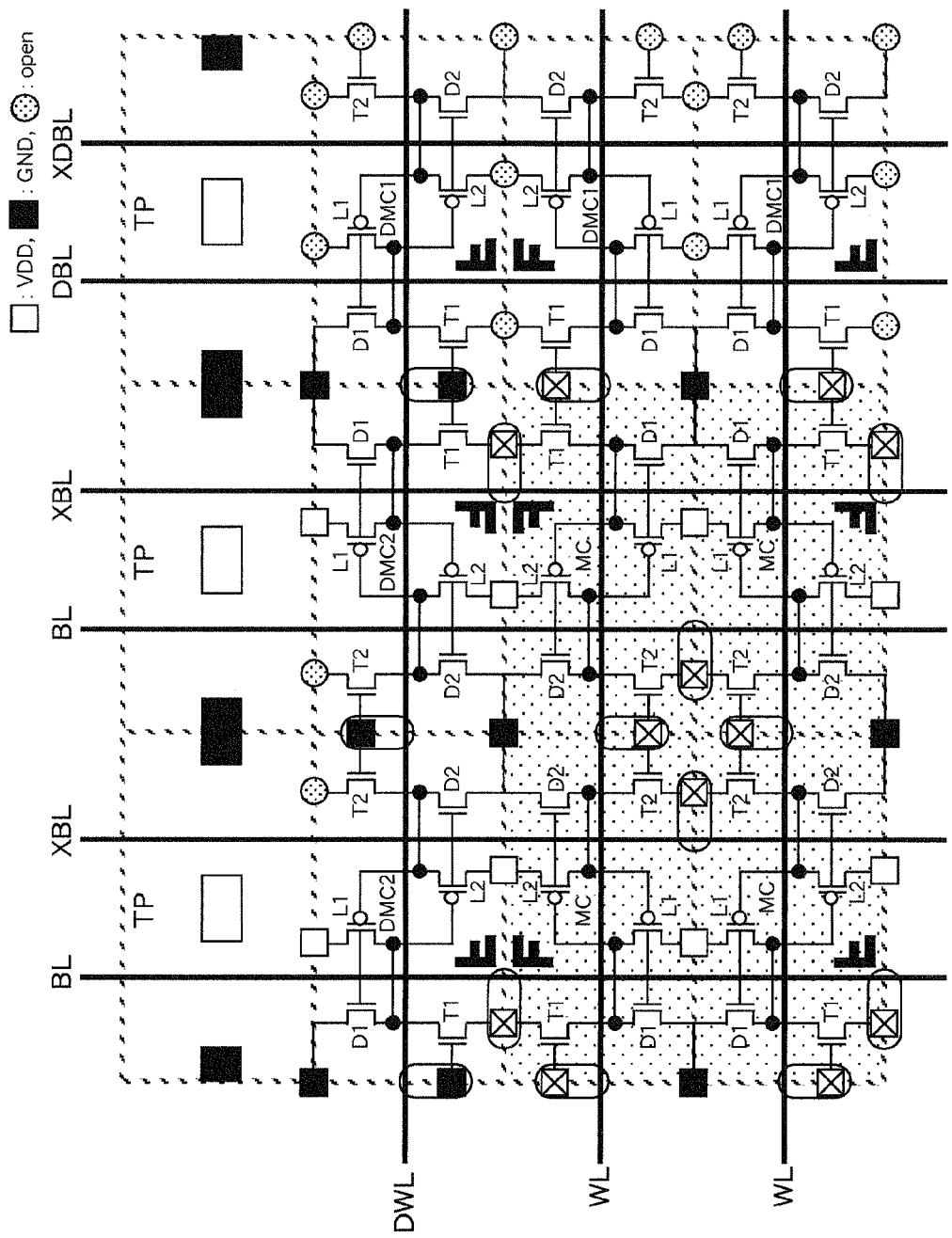
FIG. 9 illustrates a layout diagram depicting a region C illustrated in FIG. 2.

FIG. 8 and FIG. 9 illustrate a layout of a region B and a region C in FIG. 2. A white rectangle in the tap cell TP indicates a second contact coupled to the power supply line VDD. A black rectangle in the tap cell TP indicates a second contact coupled to the ground line GND. The second contact is a contact for directly coupling the power supply line VDD and the ground line GND to the diffusion layer area. Note that the second contact may also be formed of a contact coupled to the diffusion layer area, the first contact and a contact formed on an upper layer of the first contact.

A half-tone dot meshing cell indicates the real memory cell MC. The sources of the respective driver transistors D1, D2 are common to four memory cells which are adjacent to one another. Accordingly, the first contact of the source of the driver transistor D1 is coupled to the ground line GND regardless of a type of the memory cell. The first contact is shared by the adjacent real memory cell MC, DMC1 or DMC2. Further, as described in FIG. 4, in the dummy memory cell DMC1 located on the left side of the real memory cell MC, the gate of the transfer transistor T1 is coupled to the word line WL via the first contact. As above, in the dummy memory cell DMC1, the first contact shared by the real memory cell MC is disposed in a boundary area adjacent to the real memory cell MC. The first contact which is supposed to be disposed in a boundary area which is not adjacent to the real memory cell MC is lacking compared to that in the real memory cell MC.

Meanwhile, in the dummy memory cell DMC2, the gates of the transfer transistors T1, T2 are coupled to the ground lines GND via the first contacts. The gates of the transfer transistors T1, T2 are coupled to the dummy word line DWL coupled to the ground lines GND. Further, only the first contact for coupling the transfer transistor T2 to the bit line BL or XBL is lacking compared to the first contact in the real memory cell MC. In other words, in the dummy memory cell DMC2, the first contact shared by the real memory cell MC is disposed in a boundary area adjacent to the real memory cell MC. At least one of the first contacts which are supposed to be disposed in a boundary area which is not adjacent to the real memory cell MC is lacking compared to the first contacts in the real memory cell MC. Further, the dummy memory cell DMC1 disposed under the word line WL and the dummy memory cell DMC2 disposed under the bit line BL or XBL have the different number of the first contacts formed therein.

Figure 10:
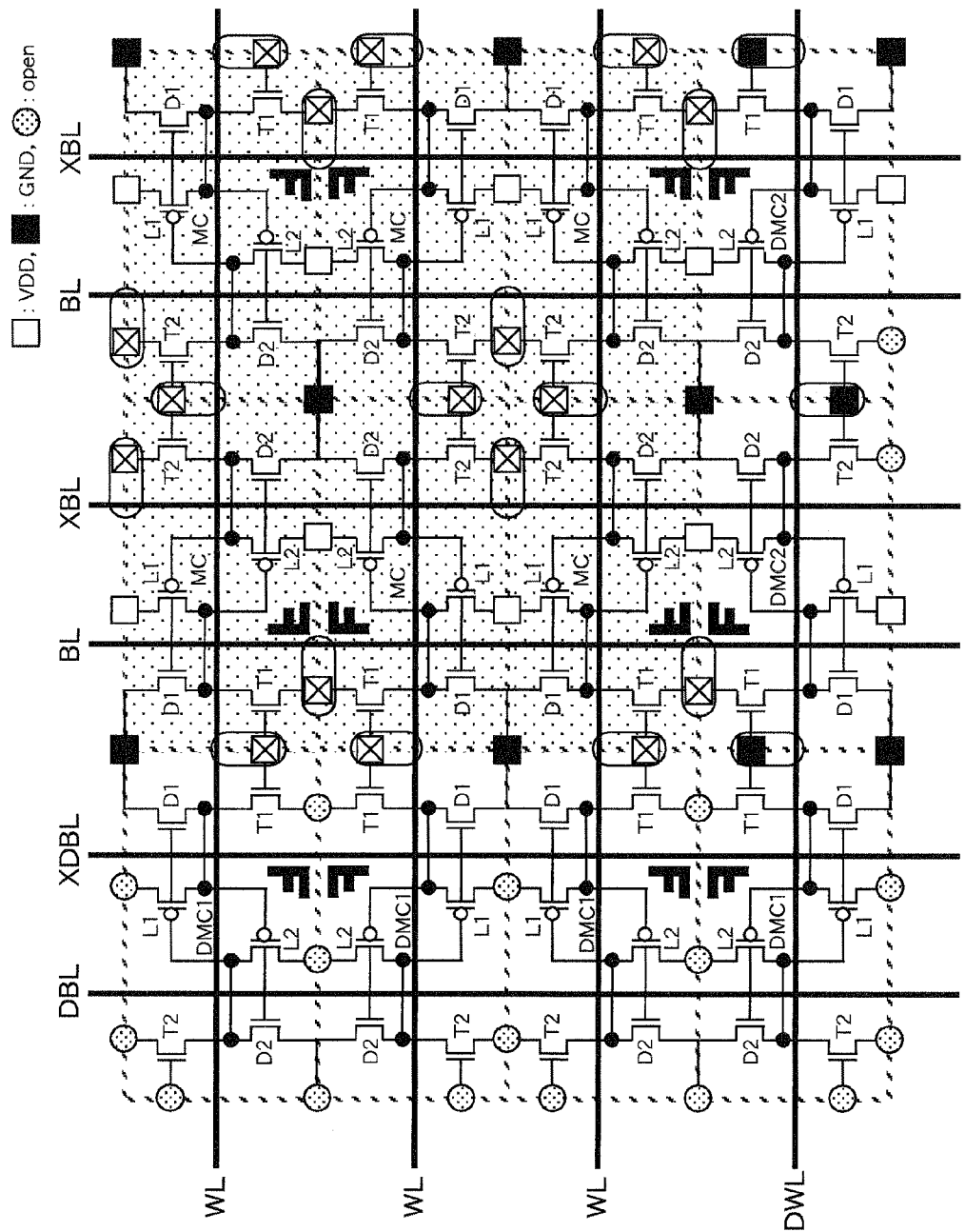
FIG. 10 illustrates a layout diagram depicting a region D illustrated in FIG. 2.
Figure 11:
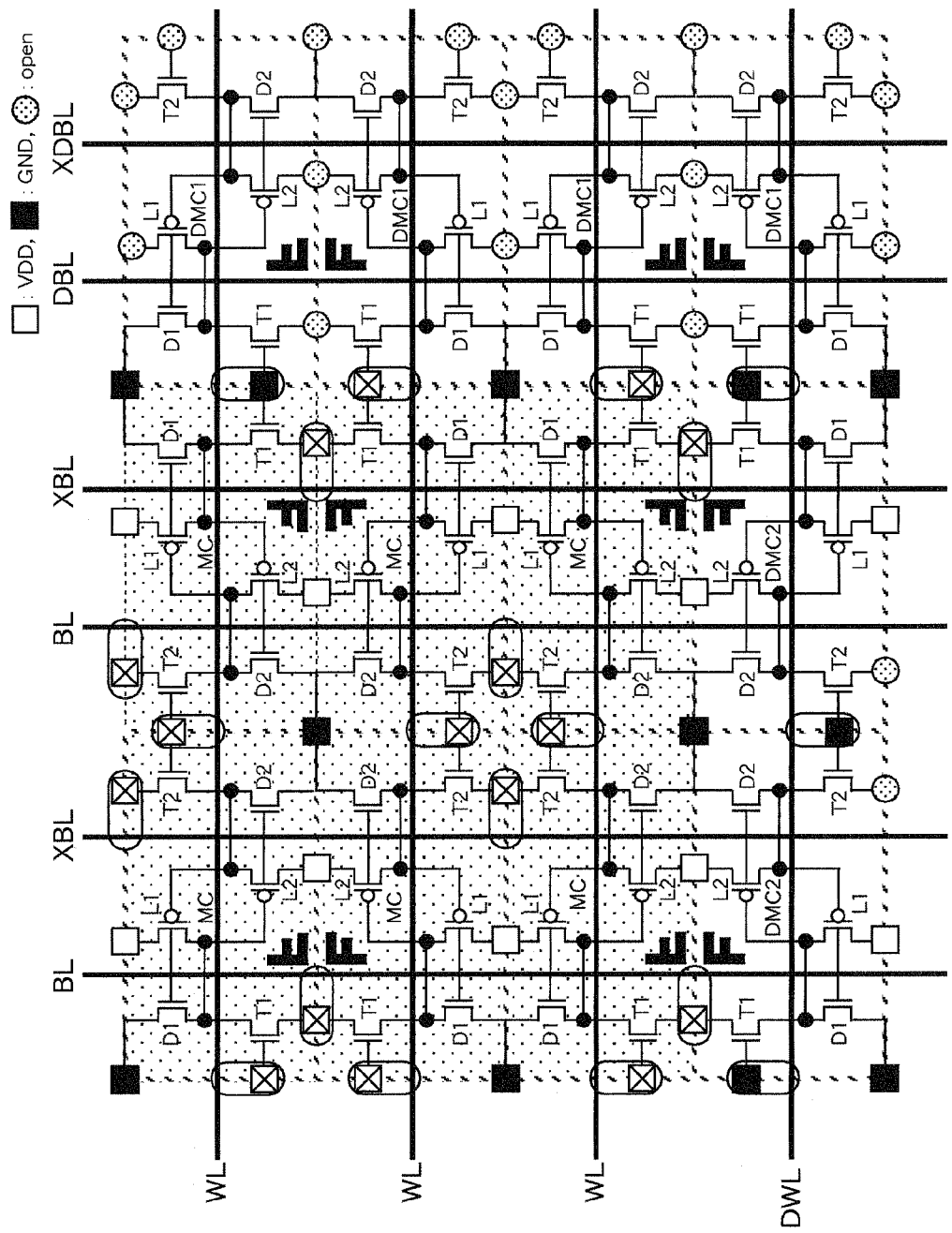
FIG. 11 illustrates a layout diagram depicting a region E illustrated in FIG. 2.

FIG. 10 and FIG. 11 illustrate a layout of a region D and a region E in FIG. 2. Also in the regions D and E, only the first contact coupled to the gate of the transfer transistor T1 and the second contact coupled to the source of the driver transistor D1 are disposed, and the other first contacts are lacking in the dummy memory cell DMC1. In the dummy memory cell DMC2, only the first contact for coupling the transfer transistor T2 to the bit line BL or XBL is lacking compared to the first contact in the real memory cell MC.

Figure 12:
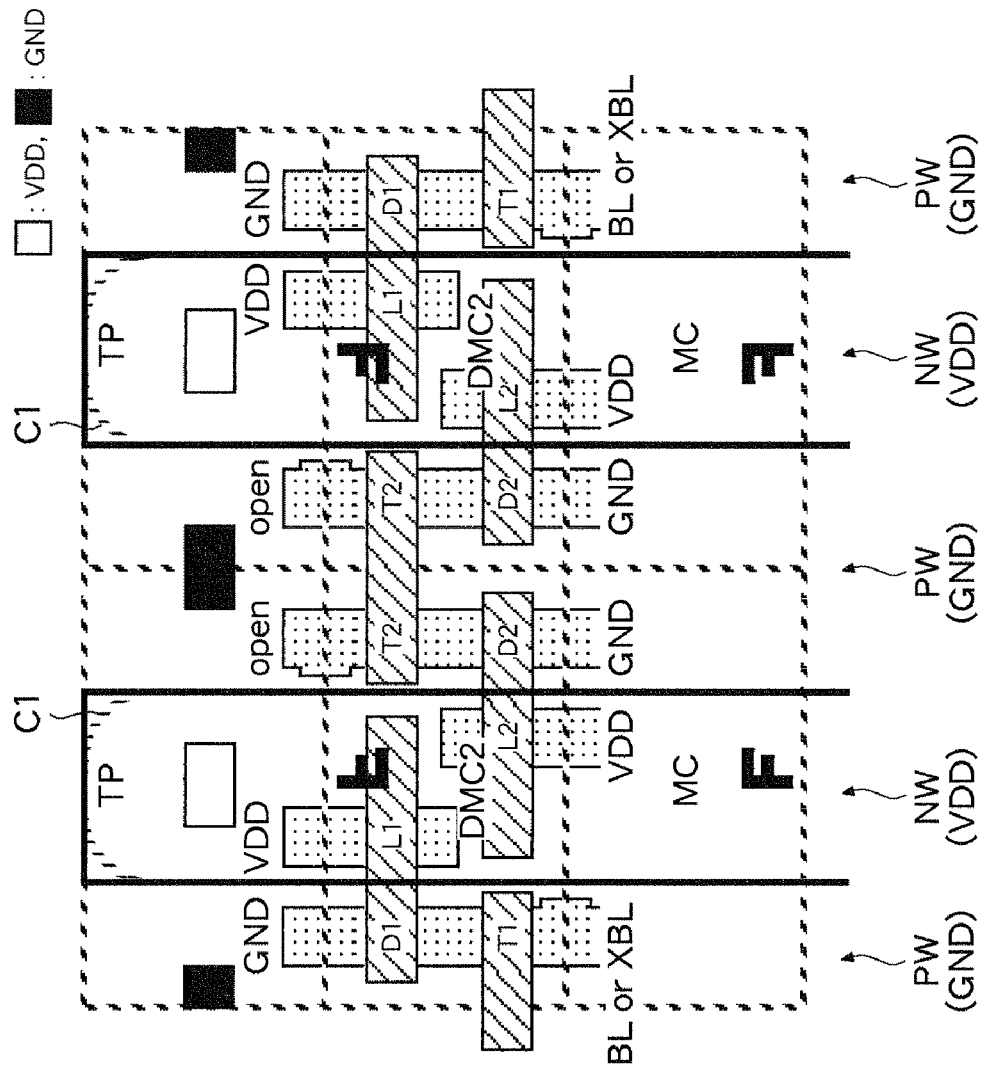
FIG. 12 illustrates a layout diagram depicting a substantial part of a well region illustrated in FIG. 8.

FIG. 12 illustrates a layout of a substantial part of a well region in FIG. 8. In this example, the tap cell TP is disposed on an outside of the dummy memory cell DMC2 (upper side of the drawing). Accordingly, for example, the n-type well region NW and the p-type well region PW are disposed with their end portions aligned with end portions of the tap cells TP. A thick solid line in the drawing indicates layout data (design data). An arc C1 illustrated by a thick dashed line indicates a shape of the n-type well region NW actually formed on the semiconductor substrate. The deformation is caused by, for example, a deformation of photo resist used for forming the well regions NW, PW due to a variation in manufacturing conditions. Specifically, there is a chance that a shape of the photo resist is changed due to a difference in densities of the layout patterns of the well regions NW, PW in a boundary between the memory cell array ARY and the peripheral circuit during the manufacture of the SRAM, resulting that the well region may not be formed normally.

Either source or drain (diffusion layer area) of the transfer transistor T2 of the dummy memory cell DMC2 lacks the first contact, and thus is in an open state (open). Accordingly, if by any chance a formation position of the n-type well region NW is displaced or the n-type well region NW is deformed due to the variation in the manufacturing conditions, and the diffusion layer area of the transfer transistor T2 is short-circuited with the n-type well region NW, it is possible to prevent an abnormal power supply current from being flown, resulting that the latch up can be prevented.

Note that when the tap cell TP is disposed on the outside of the dummy memory cell DMC2, the end portion of the n-type well region NW is distant from an end portion of the dummy memory cell DMC2. Accordingly, even when the end portion of the n-type well region NW is deformed, a leak path is unlikely to occur between the source of the load transistor L1 (VDD) and the p-type well region PW (GND). Therefore, it is possible to prevent the occurrence of latch up caused by the deformation of the n-type well region NW.

As described above, in the first embodiment, the dummy memory cells DMC1, DMC2 are formed by lacking a part of the first contacts, so that even when the well regions NW, PW are not formed normally, it is possible to prevent the abnormal power supply current from being flown into the dummy memory cells DMC1, DMC2. In other words, it is possible to prevent the occurrence of latch up caused by the short-circuit between the well regions NW, PW and the diffusion layer area. The latch up may occur depending on an operating environment of a system on which the SRAM is mounted. In the present embodiment, it is possible to prevent the occurrence of latch up, so that a reliability of the SRAM can be improved.

The first contact lacking in each of the dummy memory cells DMC1, DMC2 is not the first contact shared by the real memory cell MC, but the first contact which is supposed to be disposed in the boundary area which is not adjacent to the real memory cell MC. It is possible to prevent the occurrence of latch up without lacking the first contact coupled to the real memory cell MC, namely, by maintaining a state in which the real memory cell MC operates normally.

The specification of the first contact is differed between the dummy memory cells DMC1, DMC2, so that it is possible to prevent the occurrence of latch up in a best way according to the position of the dummy memory cells DMC1, DMC2. Since the dummy memory cells DMC1, DMC2 have the same transistor structure as that of the real memory cell MC, it is possible to prevent a deformation of a shape of the transistor and the like in the real memory cell MC located on the peripheral part of the memory cell array ARY. In other words, even when a countermeasure against the latch up is performed on the dummy memory cells DMC1, DMC2, there is no chance that functions of the dummy memory cells DMC1, DMC2 deteriorate.

Figure 13:
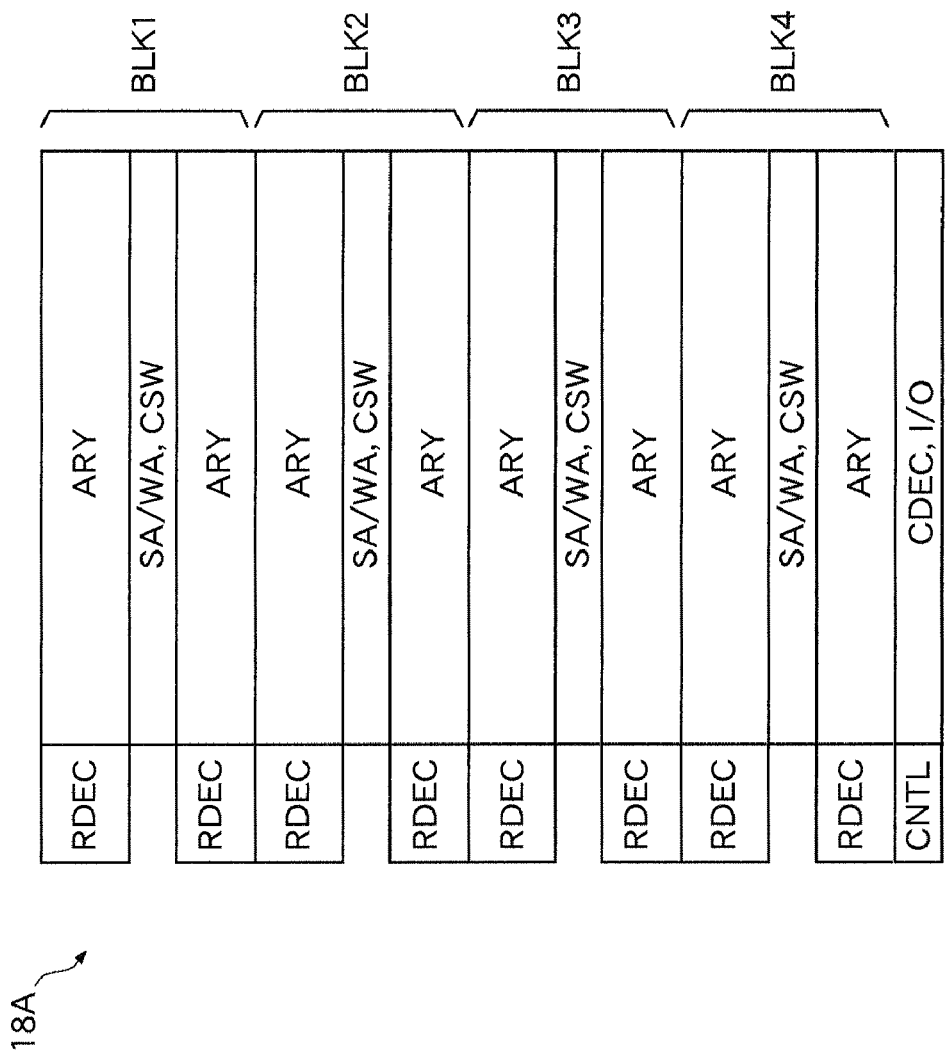
FIG. 13 illustrates a block diagram depicting a memory core in a second embodiment.

FIG. 13 illustrates a memory core 18A in a second embodiment. The same elements as those explained in the first embodiment are denoted by the same reference numerals and symbols, and a detailed explanation thereof will be omitted. In this embodiment, the SRAM includes four memory blocks BLK1-4. Each of the memory blocks BLK1-4 includes two memory cell arrays ARY, and sense amplifiers SA, write amplifiers WA and column switches CSW which are shared by the memory cell arrays ARY. The other structure is the same as the structure of the first embodiment.

Figure 14:
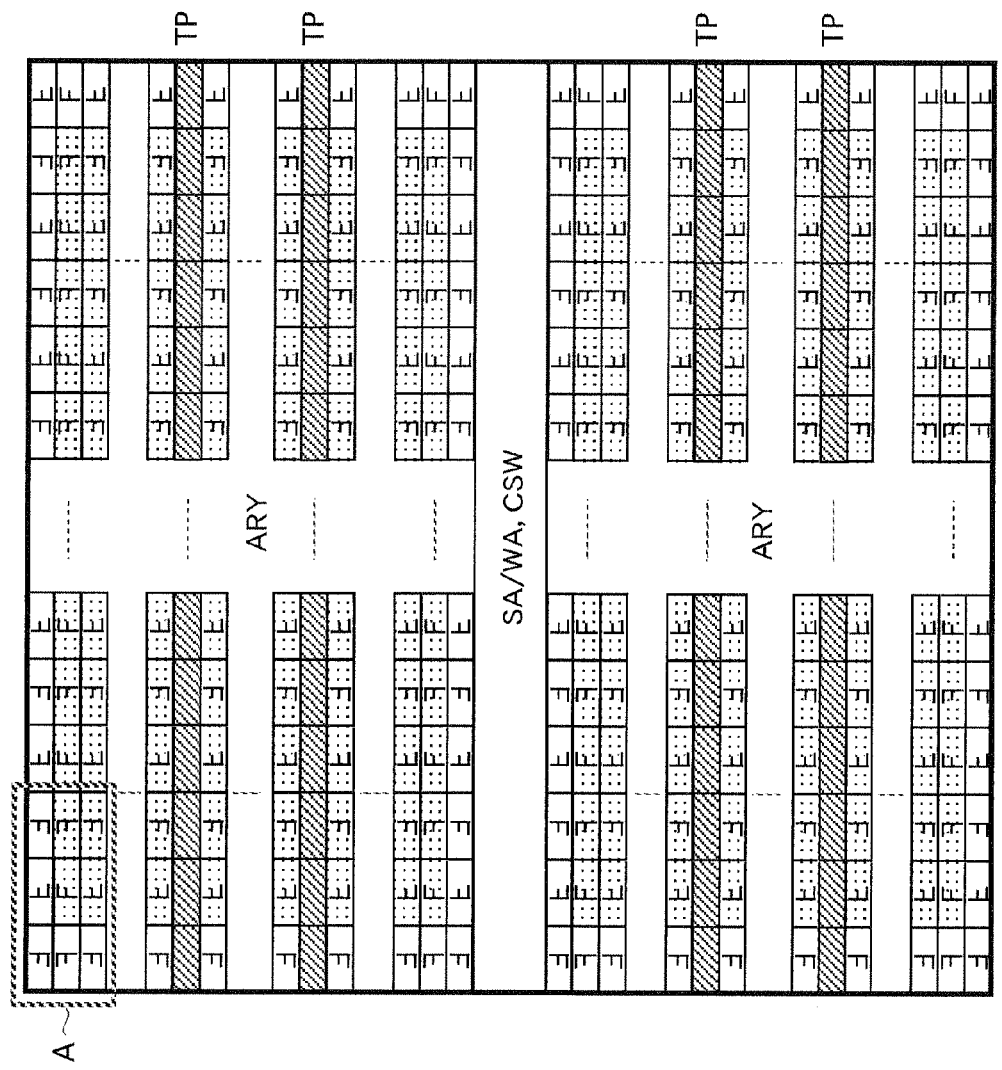
FIG. 14 illustrates a block diagram depicting details of a memory block illustrated in FIG. 13.

FIG. 14 illustrates details of the memory block (for instance, BLK1) illustrated in FIG. 13. In each of the memory cell arrays ARY, a half-tone dot meshing quadrangle indicates the real memory cell (MC). A white rectangle indicates the dummy memory cell (DMC1 or DMC2). The dummy memory cells are disposed in a frame shape on the peripheral part of the matrix of the real memory cells. A dashed quadrangle indicates the tap cell TP. In the respective memory cell arrays ARY, a plurality of memory cell rows are formed by the real memory cells arranged in a lateral direction in the drawing. Each of the memory cell rows is coupled to the word line extended in the lateral direction in the drawing. A symbol F in the drawing indicates a direction of a transcription of layout pattern.

Among the predetermined number of memory cell columns arranged in a vertical direction in the drawing, tap cell rows formed by arranging the tap cells TP are disposed. The tap cell TP has a structure illustrated in FIG. 8 and FIG. 9, and has the second contact for supplying the power supply voltage VDD to the n-type well region NW and the second contact for supplying the ground voltage GND to the p-type well region PW.

Figure 15:
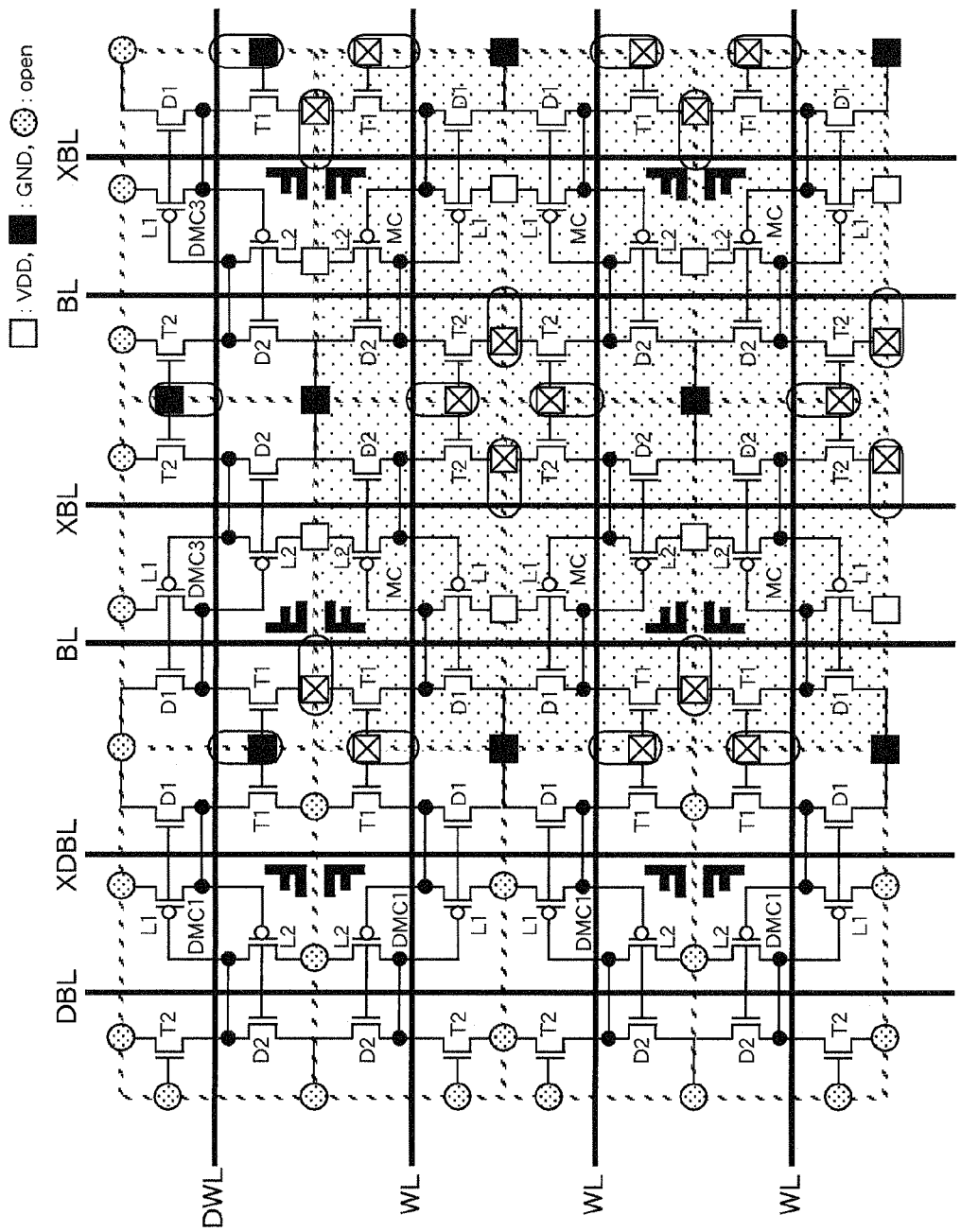
FIG. 15 illustrates a layout diagram depicting a region A illustrated in FIG. 14.

FIG. 15 illustrates a layout of a region A in FIG. 14. What differs from the first embodiment (FIG. 8) is that a dummy memory cell DMC3 is formed instead of the dummy memory cell DMC2, and the tap cell TP does not exist on an outside of the dummy memory cell DMC3. The dummy memory cell DMC3 differs from the dummy memory cell DMC2 in that it lacks the first contact coupled to the source of the driver transistor D1 and the first contact coupled to the source of the load transistor L1. The other structure of the dummy memory cell DMC3 is the same as the structure of the dummy memory cell DMC2. In this embodiment, all of the first contacts on a peripheral part of a dummy memory cell group (DMC1, DMC3) disposed in a frame shape are lacking, as confirmed from FIG. 15.

Figure 16:
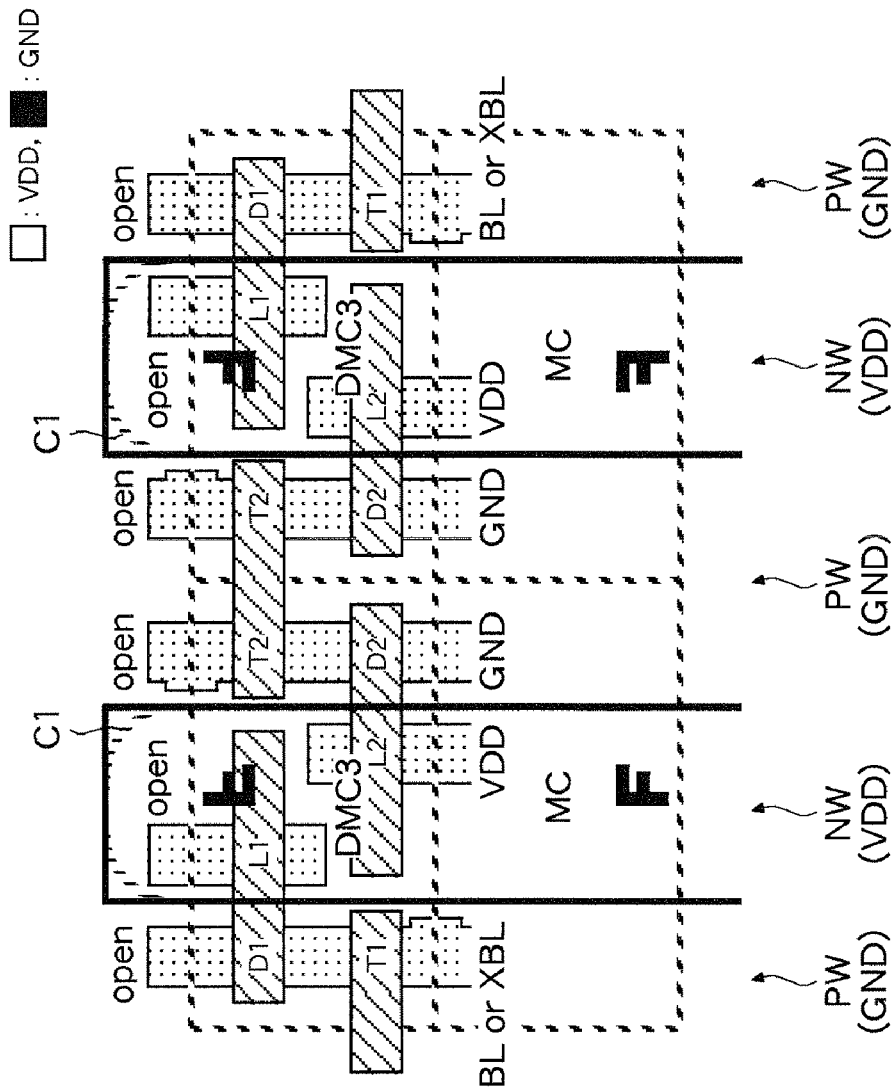
FIG. 16 illustrates a layout diagram depicting a substantial part of a well region illustrated in FIG. 15.

FIG. 16 illustrates a layout of a substantial part of a well region in FIG. 15. In this example, the tap cells TP are not disposed on the outside of the dummy memory cells DMC3. Accordingly, end portions of the n-type well region NW and the p-type well region PW are slightly protruded from end portions of the dummy memory cells DMC3, for instance. Similarly as in the aforementioned FIG. 12, a thick solid line in the drawing indicates layout data (design data). An arc C1 illustrated by a thick dashed line indicates a shape of the n-type well region NW actually formed on the semiconductor substrate. When the dummy memory cell DMC3 is disposed on the peripheral part of the memory cell array ARY, the end portion of the n-type well region NW and the end portion of the dummy memory cell DMC3 are in positions relatively close to each other. Therefore, if the end portion of the n-type well region NW is deformed, the source of the load transistor L1 (original voltage is VDD) and the p-type well region PW (GND) may be electrically coupled. In order to prevent this, the first contact coupled to the source of the load transistor L1 is not disposed in the dummy memory cell DMC3 and the source of the load transistor L1 is in an open state (open), which is different from the first embodiment (FIG. 12).

As described above, also in the second embodiment, it is possible to obtain the same effect as that of the aforementioned first embodiment. In addition, in this embodiment, all of the first contacts on the peripheral part of the dummy memory cells DMC1, DMC2 disposed in the frame shape are lacking compared to the first contacts in the real memory cells MC. Accordingly, even if a formation position of the n-type well region NW is displaced or the n-type well region NW is deformed due to the variation in the manufacturing conditions, it is possible to surely prevent an abnormal power supply current from being flown, resulting that the latch up can be prevented. In particular, also when the tap cells TP are disposed among the real memory cell columns, it is possible to surely prevent the latch up.

Figure 17:
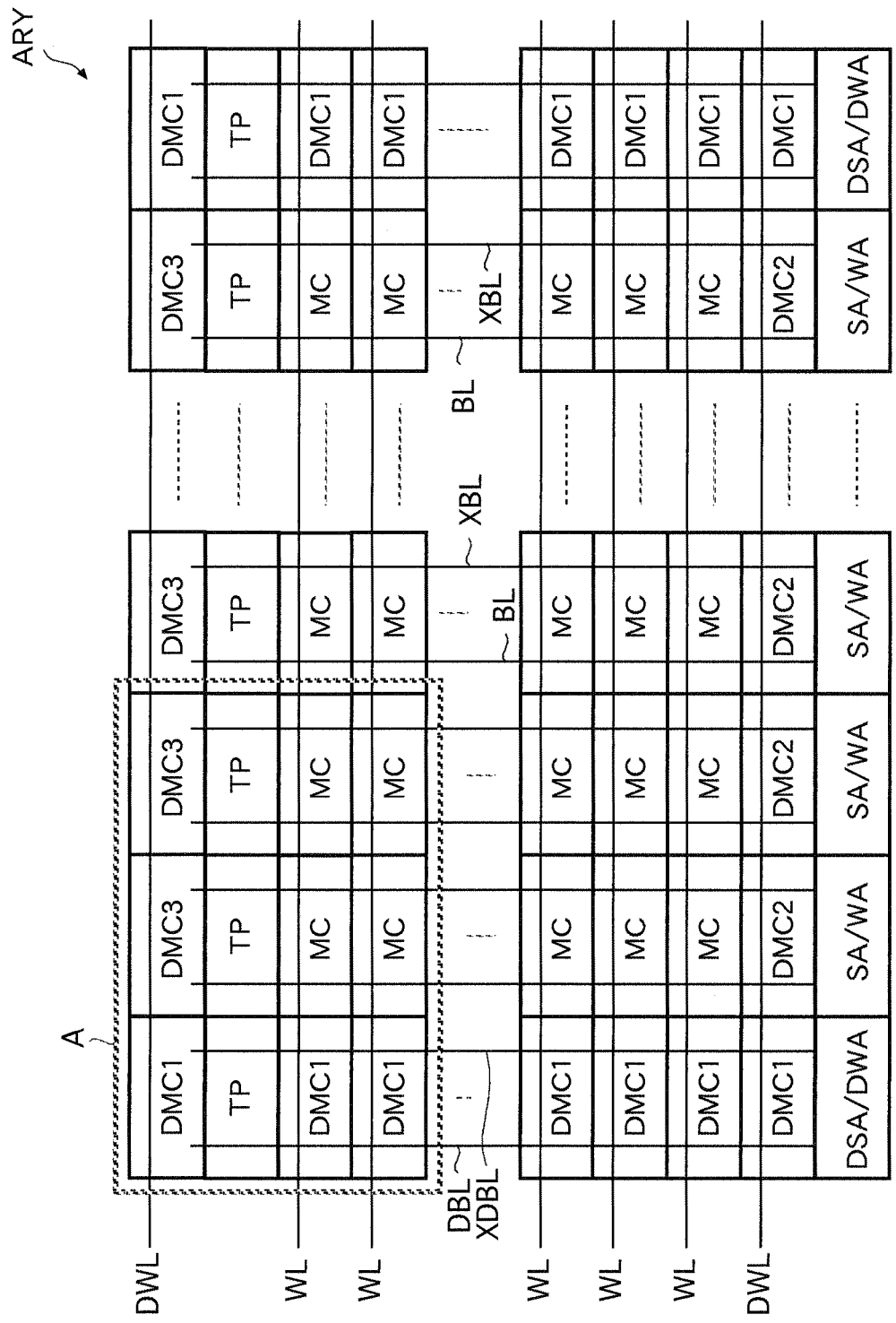
FIG. 17 illustrates a block diagram depicting details of a memory cell array in a third embodiment.

FIG. 17 illustrates details of a memory cell array ARY in a third embodiment. What differs from the first embodiment (FIG. 2) is that the dummy memory cell DMC3 is disposed instead of the dummy memory cell DMC2, and positions of the tap cells TP, and the dummy memory cells DMC1, DMC3 are reversed. The other structure is the same as the structure of the first embodiment. Specifically, a semiconductor memory of this embodiment is an SRAM, and the memory cell array ARY has memory cells of SRAM.

Figure 18:
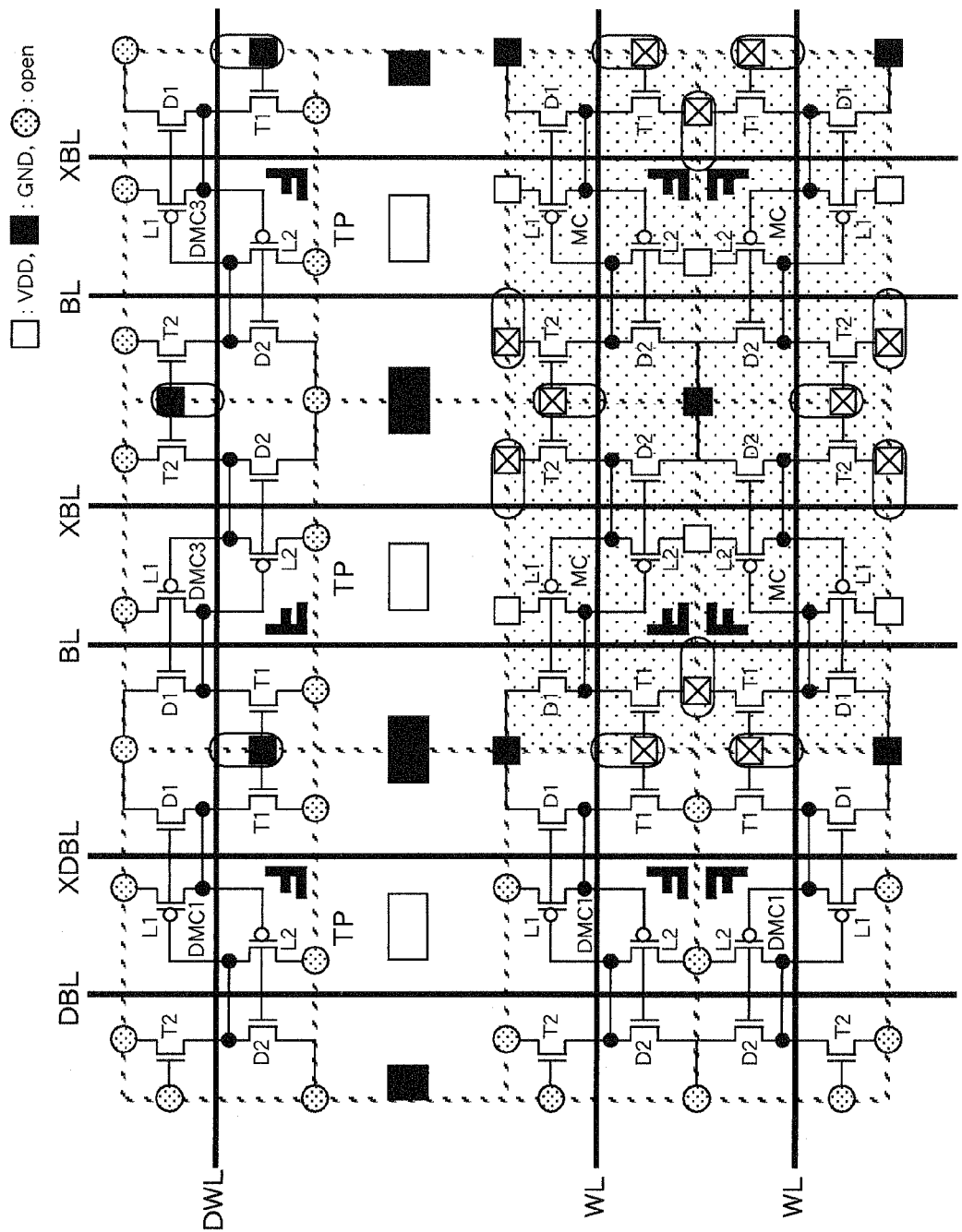
FIG. 18 illustrates a layout diagram depicting a region A illustrated in FIG. 17.

FIG. 18 illustrates a layout of a region A in FIG. 17. In this embodiment, similarly as in the second embodiment, the tap cells TP do not exist on the outside of the dummy memory cells DMC3. For this reason, the first contact coupled to the source of the driver transistor D1 and the first contact coupled to the source of the load transistor L1 are lacking in the dummy memory cell DMC3. A structure of the tap cell TP is the same as that in the aforementioned FIG. 8. Further, all of the first contacts on the peripheral part of the dummy memory cell group (DMC1, DMC3) disposed in the frame shape are lacking. As described above, also in the third embodiment, it is possible to obtain the same effect as that of the aforementioned first and second embodiments.

Figure 19:
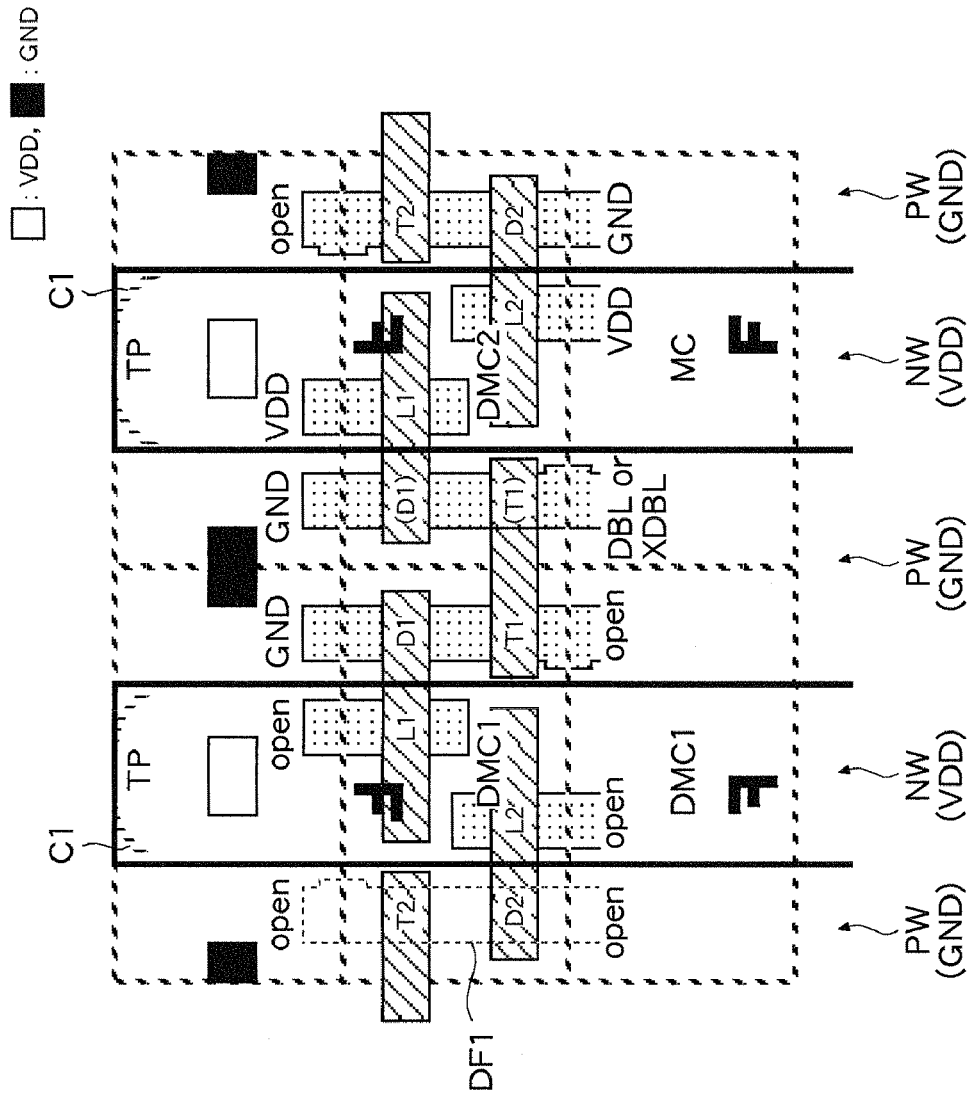
FIG. 19 illustrates a layout diagram depicting a substantial part of a well region in a fourth embodiment.

FIG. 19 illustrates a layout of a substantial part of a well region in a fourth embodiment. This layout corresponds to six cells on an upper left in the aforementioned FIG. 8. In this embodiment, the dummy memory cell DMC1 disposed on the upper left in FIG. 8 is structured by lacking a diffusion layer area DF1 positioned on the peripheral part of the memory cell array ARY compared to the diffusion layer area DF1 in the real memory cell MC. The diffusion layer area DF1 is an area for forming the source and the drain of the transfer transistor T2, and the source and the drain of the driver transistor D2. The other structure is the same as the structure of the first embodiment. Specifically, a semiconductor memory of this embodiment is an SRAM. Since the diffusion layer area DF1 is not formed, even if the n-type well region NW on the left side of the drawing is displaced to the diffusion layer area DF1 side or deformed to be electrically coupled to the diffusion layer area DF1, it is possible to prevent a leak current from being flown from the n-type well region NW (VDD) into the diffusion layer area DF1.

As described above, also in the fourth embodiment, it is possible to obtain the same effect as that of the aforementioned first and second embodiments. In addition, in this embodiment, the diffusion layer areas DF1 positioned on the peripheral side of the dummy memory cells DMC1 disposed in the frame shape are lacking compared to those in the real memory cells MC. Accordingly, even if a formation position of the n-type well region NW is displaced or the n-type well region NW is deformed due to the variation in the manufacturing conditions, it is possible to surely prevent an abnormal power supply current from being flown, resulting that the latch up can be prevented.

Figure 20:
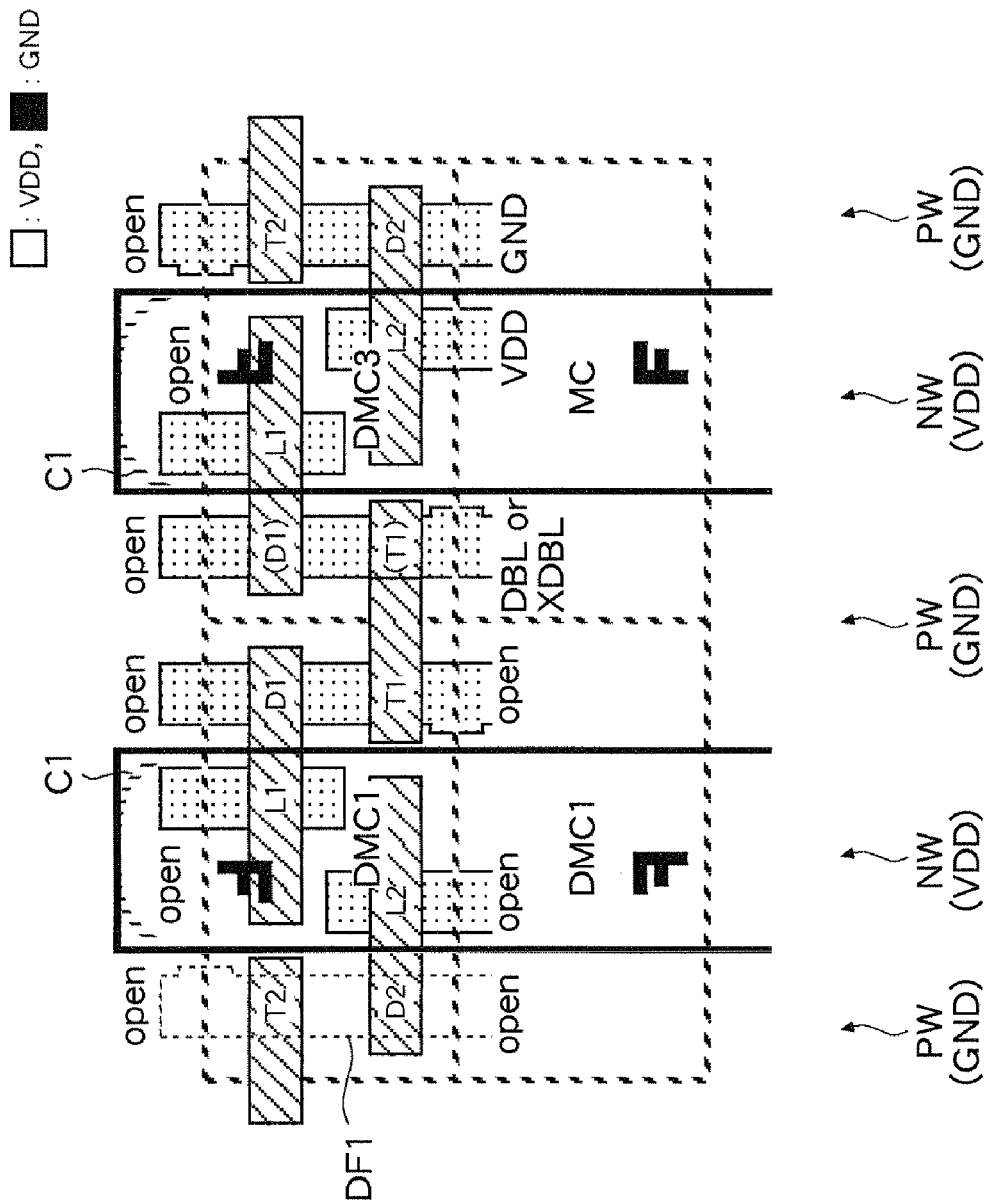
FIG. 20 illustrates a layout diagram depicting a substantial part of a well region in a fifth embodiment.

FIG. 20 illustrates a layout of a substantial part of a well region in a fifth embodiment. This layout corresponds to six cells on an upper left in the aforementioned FIG. 15. In this embodiment, similarly as in the fourth embodiment (FIG. 19), the dummy memory cell DMC1 disposed on the upper left in FIG. 15 is structured by lacking the diffusion layer area DF1 positioned on the peripheral part of the memory cell array ARY compared to the diffusion layer area DF1 in the real memory cell MC. The other structure is the same as the structure of the first and second embodiments. Specifically, a semiconductor memory of this embodiment is an SRAM. As described above, also in the fifth embodiment, it is possible to obtain the same effect as that of the aforementioned first, second, and fourth embodiments.

Figure 21:
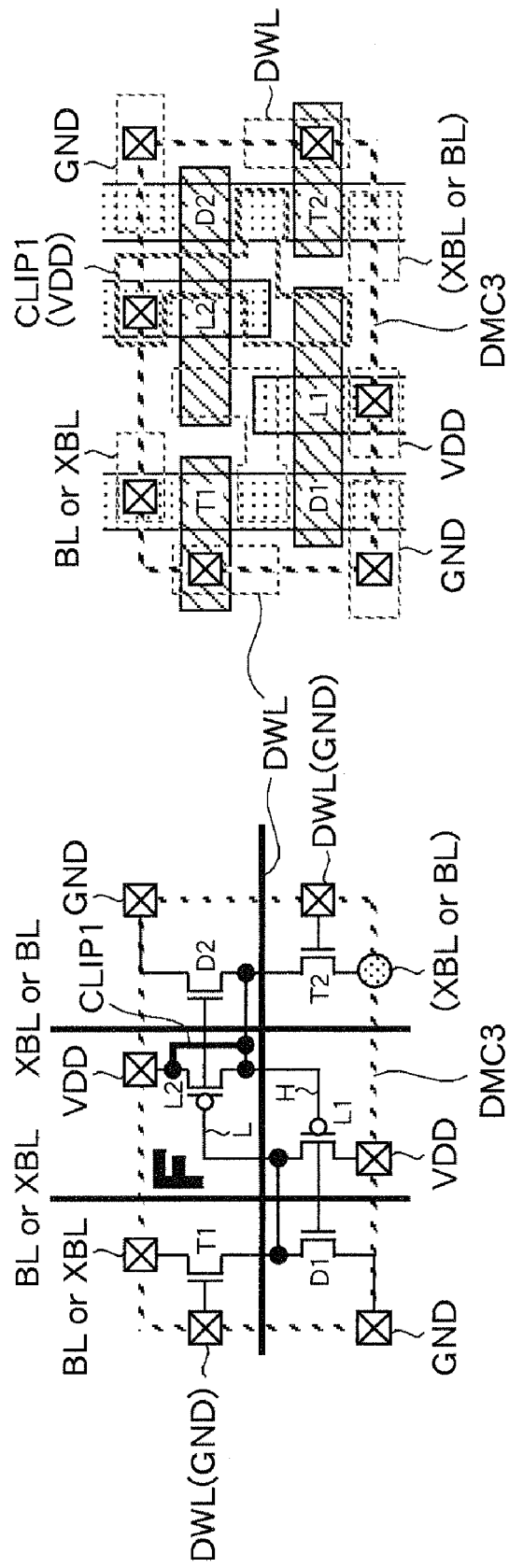
FIG. 21 illustrates an explanatory diagram depicting details of layout of a dummy memory cell DMC1 in a sixth embodiment.

FIG. 21 illustrates details of a dummy memory cell DMC3 in a sixth embodiment. The dummy memory cell DMC3 disposed under the bit line BL or XBL is different from the dummy memory cell DMC3 in the second and third embodiments in that it has a clip wire CLIP1 for coupling the drain of the driver transistor D2 and the drain of the transfer transistor T2 (the input/output node ND2 of the latch LT illustrated in FIG. 1) to the power supply line VDD. The other structure is the same as the structure of the second or third embodiment. Specifically, a semiconductor memory of this embodiment is an SRAM.

The clip wire CLIP1 is formed by using the second metal wiring layer, as illustrated on the right side of the drawing. One of the input/output nodes of the latch structuring the dummy memory cell DMC3 is clipped to the power supply voltage VDD, which enables to fix the voltage of the input/output nodes of the latch. Accordingly, it is possible to prevent the respective nodes of the latch of the dummy memory cell DMC3 which does not hold data from being in floating states. Therefore, it is possible to prevent a charge up of the gate of the transistor that structures the latch. As a result of this, it is possible to prevent an occurrence of insulation failure of the gate due to the charge up, or the occurrence of latch up due to the charge up.

As described above, also in the sixth embodiment, it is possible to obtain the same effect as that of the aforementioned first and second embodiments. In addition, in this embodiment, since the input/output node of the latch of the dummy memory cell DMC2 is clipped to the power supply voltage VDD, it is possible to prevent the charge up of the gate of the transistor, or the insulation failure of the gate and the occurrence of latch up.

Figure 22:
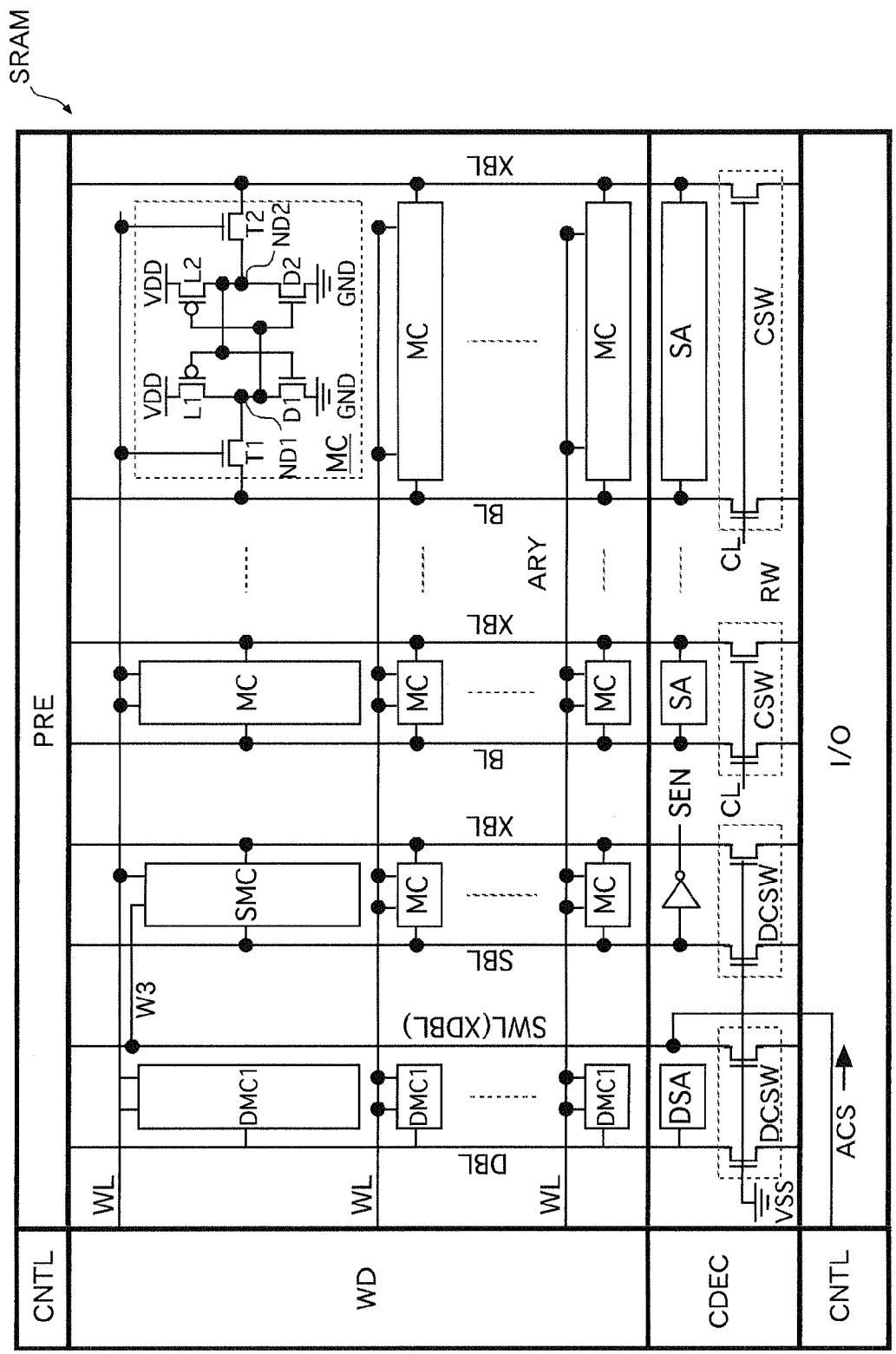
FIG. 22 illustrates a block diagram depicting a seventh embodiment.

FIG. 22 illustrates a seventh embodiment. The same elements as those explained in the first embodiment are denoted by the same reference numerals and symbols, and a detailed explanation thereof will be omitted. This embodiment is structured by the SRAM of the first embodiment to which a self-timing method is introduced. The self-timing method is a method in which an operation timing of the sense amplifier SA is adjusted depending on a length (load capacitance) of the bit lines BL, XBL. The self-timing method is adopted based on a design method (compiled memory) in which the size of the memory cell array ARY (length of the bit lines BL, XBL) is variable in accordance with a system specification of a user.

The memory cell array ARY has a self-timing memory cell SMC formed on the most distant position from the sense amplifier SA (one end side of a column of the real memory cells MC arranged in a vertical direction in the drawing) and constantly reading a predetermined value. A transfer transistor of the self-timing memory cell SMC is turned on when it receives an access signal ACS output from the operation control circuit CNTL in synchronization with an access request from the memory cell MC, and outputs a data signal which is constantly in a low logic level to a self timing bit line SBL. The access signal ACS is transmitted to a gate of the transfer transistor of the self-timing memory cell SMC via a self timing word line SWL utilizing the dummy bit line XDBL and a wire W3.

The data signal from the self-timing memory cell SMC transmitted to the self timing bit line SBL is amplified and inverted in an inverter and output as a sense amplifier enable signal SEN. Subsequently, the sense amplifier SA disposed on the other end side of the column of the real memory cells MC arranged in the vertical direction in the drawing starts an amplifying operation in synchronization with the sense amplifier enable signal SEN and amplifies the data signal read from the real memory cell MC. In the self-timing method, the sense amplifier SA constantly operates at the best timing in synchronization with the sense amplifier enable signal SEN whose generation timing is variable depending on the length of the bit lines BL, XBL.

Figure 23:
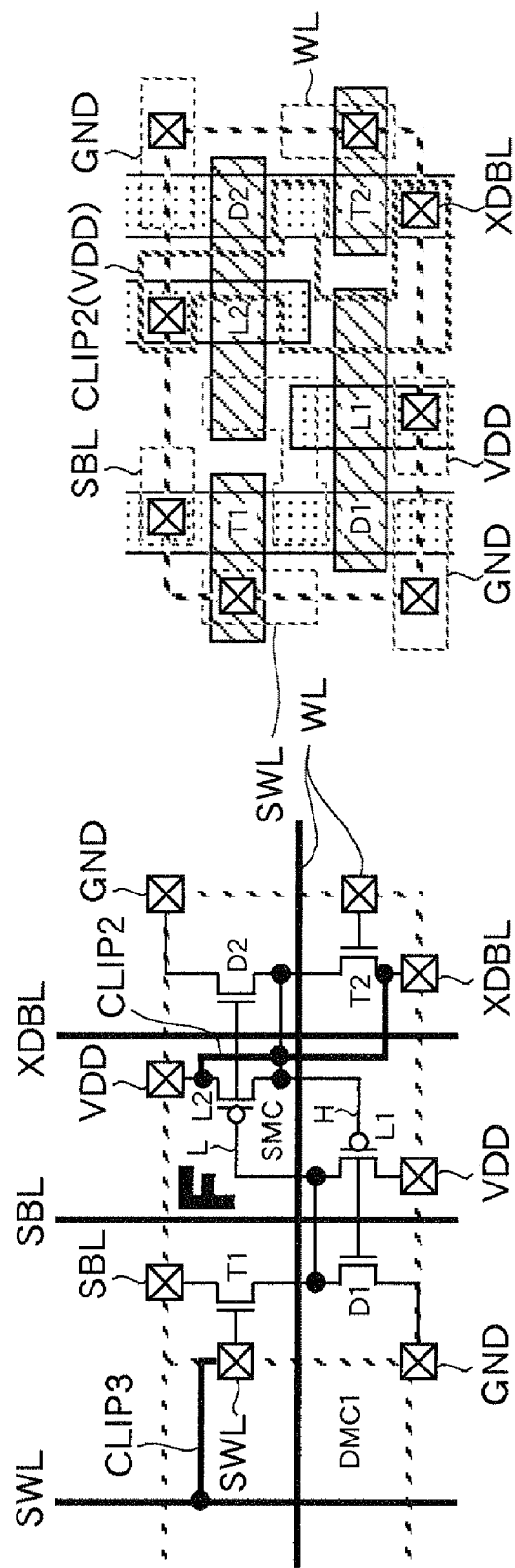
FIG. 23 illustrates an explanatory diagram depicting details of layout of a self-timing memory cell illustrated in FIG. 22.

FIG. 23 illustrates details of the self-timing memory cell SMC illustrated in FIG. 22. The self-timing memory cell SMC is structured by disposing, instead of the clip wire CLIP1 illustrated in FIG. 21, a clip wire CLIP2 on the real memory cell MC. As illustrated on the right side of the drawing, the clip wire CLIP2 is formed by using the second metal wiring layer. The clip wire CLIP2 couples the drain of the driver transistor D2, the drain of the transfer transistor T2 and the dummy bit line XDBL to the power supply line VDD.

Figure 24:
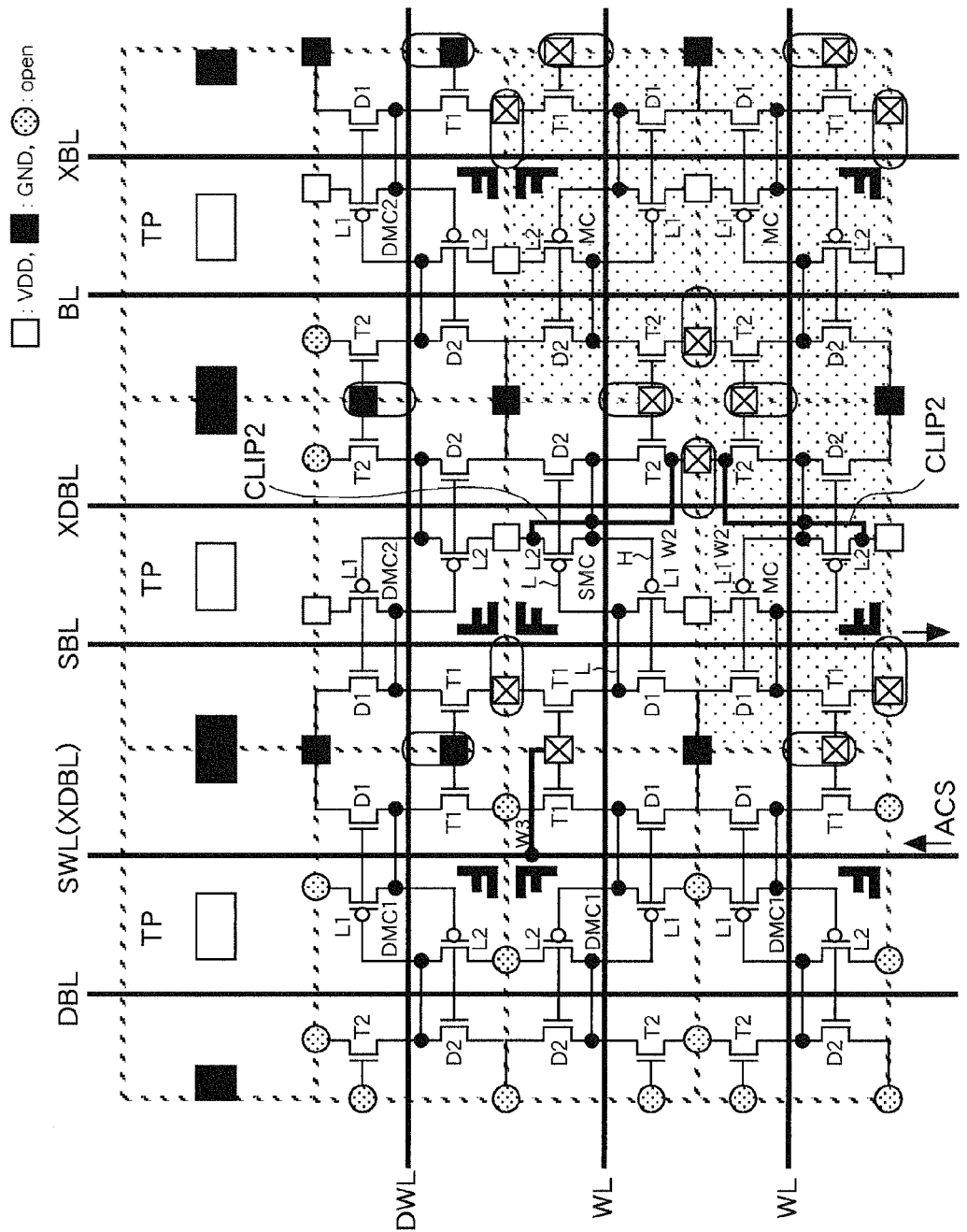
FIG. 24 illustrates a layout diagram depicting a memory cell array in the seventh embodiment.

FIG. 24 illustrates a layout of a substantial part of the memory cell array ARY of the seventh embodiment. In this embodiment, the real memory cell MC disposed on the upper left in the first embodiment (FIG. 8) is replaced with the self-timing memory cell SMC. On an upper part of the self-timing memory cell SMC, the self timing bit line SBL and the dummy bit line XDBL are wired. In the real memory cell MC disposed in a lower part of the self timing bit line SBL, the clip wire CLIP2 being the same clip wire in the self-timing memory cell SMC is formed. However, these real memory cells MC do not hold data supplied via an external terminal.

As described above, in the seventh embodiment, even when the present embodiment is applied to the SRAM to which the self-timing method is introduced, it is possible to obtain the same effect as that of the aforementioned first embodiment.

Note that in the aforementioned embodiments, an example in which the present embodiment is applied to the SRAM was described. The present embodiment is not limited to such embodiments. For example, when the present embodiment is applied to another semiconductor memory such as a DRAM, it is also possible to obtain the same effect.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be mage hereto without departing from the spirit and scope of the invention.

What is claimed is:

1. A semiconductor memory, comprising:
real memory cells having transistors and disposed in a matrix shape;
dummy memory cells disposed on an outside of the real memory cells positioned on a peripheral part of the matrix and each having at least one transistor that has a same structure as a structure of the transistor of each of the real memory cells; and
first contacts coupling between two wiring layers laminated on a semiconductor substrate, disposed around each of the real and dummy memory cells, and shared by an adjacent real or dummy memory cell, wherein
number of the first contacts disposed in each of the dummy memory cells is set to be smaller than number of the first contacts disposed in each of the real memory cells.

2. The semiconductor memory according to claim 1, wherein
a part of wires in the dummy memory cells is set to be in an open state.

3. The semiconductor memory according to claim 1, wherein:
the first contacts in the dummy memory cells disposed in a boundary area adjacent to the real memory cells are shared by the real memory cells; and
at least one of the first contacts in the dummy memory cells disposed in a boundary area which is not adjacent to the real memory cells is lacking compared to the first contacts in each of the real memory cells.

4. The semiconductor memory according to claim 1, further comprising:
a word line extending above a row of the real memory cells arranged in a first direction; and
a bit line extending above a column of the real memory cells arranged in a second direction orthogonal to the first direction, wherein
each of the dummy memory cells disposed under the word line and each of the dummy memory cells disposed under the bit line have different number of the first contacts formed therein.

5. The semiconductor memory according to claim 4, wherein:
the real memory cells and the dummy memory cells each include a latch having complementary input/output nodes; and
each of the dummy memory cells disposed under the bit line includes a clip wire for coupling one of the complementary input/output nodes to a power supply line.

6. The semiconductor memory according to claim 1, wherein
number and a structure of the transistors formed in each of the dummy memory cells are the same as number and structure of the transistors formed in each of the real memory cells.

7. The semiconductor memory according to claim 1, wherein
all of the first contacts on a peripheral part of a dummy memory cell group disposed in a frame shape are lacking.

8. The semiconductor memory according to claim 7, further comprising
tap cells disposed among rows of the real memory cells arranged in one direction and having second contacts for coupling a well region of the semiconductor substrate to a power supply line.

9. The semiconductor memory according to claim 1, wherein:
each of the real memory cells and each of the dummy memory cells include diffusion layer areas that form sources and drains of the transistors; and
the dummy memory cells disposed in the frame shape are lacking the diffusion layer areas located on a peripheral side compared to the diffusion layer areas in the real memory cells.

10. The semiconductor memory according to claim 1, further comprising:
a bit line extending above a column of the real memory cells arranged in one direction;
a self-timing memory cell disposed on one end side of the column of the real memory cells and storing a predetermined set logic value; and
a sense amplifier disposed on the other end side of the column of the real memory cells, operating in synchronization with an output timing of a data signal read from the self-timing memory cell, and amplifying the data signal read from each of the real memory cells.

* * * * *